United States Patent [19]

Miyamoto et al.

[11] Patent Number: 5,586,076
[45] Date of Patent: Dec. 17, 1996

[54] SEMICONDUCTOR MEMORY DEVICE PERMITTING HIGH SPEED DATA TRANSFER AND HIGH DENSITY INTEGRATION

[75] Inventors: Hiroshi Miyamoto; Yoshikazu Morooka; Kiyohiro Furutani; Shigeru Kikuda, all of Hyogo, Japan

[73] Assignee: Mitsubishi Denki Kabushiki Kaisha, Tokyo, Japan

[21] Appl. No.: 304,899

[22] Filed: Sep. 13, 1994

[30] Foreign Application Priority Data

Sep. 14, 1993 [JP] Japan .................................. 5-228676

[51] Int. Cl.$^6$ ........................... G11C 7/00; G11C 11/24
[52] U.S. Cl. ........................ 365/203; 365/149; 365/63; 365/230.03
[58] Field of Search .................................. 365/203, 149, 365/51, 63, 207, 230.03

[56] References Cited

U.S. PATENT DOCUMENTS

| 4,748,591 | 5/1988 | Itoh et al. | 365/51 |
|---|---|---|---|
| 5,097,440 | 3/1992 | Konishi | 365/51 |
| 5,321,657 | 6/1994 | Arimoto et al. | 365/230.03 |
| 5,418,737 | 5/1995 | Tran | 365/63 |

FOREIGN PATENT DOCUMENTS 5-54634  3/1993  Japan .

OTHER PUBLICATIONS

"A 40-ns 64-Mo DRAM with 64-b Parallel Data Bus Architecture" Taguchi et al., IEEE Journal of Solid-State Circuits, vol. 26, No. 11m, Nov. 1991.

*Primary Examiner*—David C. Nelms
*Assistant Examiner*—Huan Hoang
*Attorney, Agent, or Firm*—Lowe, Price, LeBlanc & Becker

[57] ABSTRACT

In a memory cell array, data lines are formed into a hierarchical arrangement of sub data lines provided for every block and a main data line common to each block, and a sub data line selected by a column address among sub data lines belonging a block which are simultaneously selected by a row address is connected to a bit line. Accordingly, the sub data line length is reduced, which reduces floating capacitance, reading and writing operations can be conducted at a high speed, and sub data lines can be selectively operated. In addition, power required for charging the sub data lines can be reduced, and entire power consumption by the semiconductor memory device can be reduced as well.

19 Claims, 29 Drawing Sheets

SEMICONDUCTOR MEMORY DEVICE PERMITTING HIGH SPEED DATA TRANSFER AND HIGH DENSITY INTEGRATION

BACKGROUND OF THE INVENTION

1. Field of the Invention

The present invention relates to a semiconductor memory device with a hierarchical arrangement of data lines.

2. Description of the Background Art

In recent years, with the advancement of high density integration of semiconductor memory devices, the number of memory bits integrated on a chip increases. In a semiconductor memory device such as a dynamic RAM, a larger number of memory cells, bit lines and word lines have been arranged in the memory cell array, thus increasing the area of the memory cell array region. As a result, the length of a data line transmitting information of a bit line externally from the memory cell array increases, which increases a floating capacitance for the data line, and reading and writing operations are delayed.

In order to solve this problem, dynamic RAMs having hierarchically arranged data lines have been suggested.

FIG. 29 is a diagram showing the configuration of a memory cell array in a dynamic RAM having a conventional hierarchical arrangement of data lines. In FIG. 29, MCA is the memory cell array, RB1 to RBn row blocks provided corresponding to RD1 to RDn and receiving a row select signal through a word line WL, CD1 and CD2 column decoders selectively outputting a column select signal in response to a column address signal, CB1 and CB2 column blocks provided corresponding to CD1 and CD2, respectively and receiving a column select signal through a column select line CSL, SD1 to SDn sense amplifier block decoders provided corresponding to RD1 to RDn, respectively for outputting a block select signal when a corresponding row decoder is activated and outputs a row select signal to a row block, and SB1 to SBn are sense amplifier blocks provided corresponding to SD1 to SDn, respectively and receiving a block select signal through block select signal lines BS, /BS ("/" is for a complementary signal line). Note that only one of block select signal lines BS, /BS is shown for the purpose of simplification.

Row blocks RB1 to RBn have a plurality of word lines WL disposed in the direction of rows, and each word line WL is connected to a plurality of memory cells MC arranged in the direction of rows. The plurality of memory cells MC are each connected with one of bit lines BL, /BL, and each pair of bit lines BL, /BL is disposed in the direction of columns for a corresponding sense amplifier. The bit line pair is disposed parallel to a column select line CSL.

Sense amplifier blocks SB1 to SBn are provided with sense amplifier portions arranged corresponding to column select line CSL in the direction of rows, each sense amplifier portion has a sense amplifier circuit SA connected to a bit line pair BL, /BL in a corresponding row block for amplifying a potential difference between bit lines BL and /BL upon receiving an activation signal (not shown) from a corresponding sense amplifier decoder SD, and a switch CG (hereinafter referred to as column gate) connected to a bit line pair BL, /BL for electrically connecting bit line pair BL, /BL connected sense amplifier circuit SA to a sub data line pair LDL, /LDL upon receiving a column select signal through a column select line CSL in a corresponding column decoder CD. Note that only one of sub data lines LDL, /LDL is shown for the purpose of simplification.

One column block CB includes sub data line pairs LDL, LDL corresponding in number to sense amplifier blocks SB, and switches DG (hereinafter referred to as data line gate) corresponding in number to sense amplifier blocks SB connecting sub data line pairs LDL, /LDL to main data line pairs GDL, /GDL, respectively upon receiving a block select signal through block select signal lines BS, /BS from sense amplifier decoder SD. Note that only one of such main data line pairs GDL, /GDL is shown for the purpose of simplification.

One column block CB has a plurality of main data line pairs GDL, /GDL, the number of which is determined by the number of row decoders RD which can be activated at a time. More specifically, in the configuration shown in FIG. 29, two pairs of main data lines are provided in one column block CB, and therefore the number of row decoders RD which can be activated at a time is at most 2. However a combination of sense amplifier blocks SD1 and SDn-1 or SD2 and SDn having data line gates connected to the same main data line pair causes data collision, and therefore their row decoders RD cannot be activated at a time.

Main data line pairs GDL, /GDL are all connected to respective circuit blocks (not shown) corresponding to respective main data line pairs in a data line input/output circuit PW including a preamplifier and a writing circuit.

FIG. 30 is a diagram showing in detail column gate CG and memory cell MC. As illustrated in FIG. 30, column gate CG is formed of transfer gates which electrically connects bit line BL and sub data line LDL, and electrically connects bit line /BL and sub data line /LDL in response to a high logic signal transmitted to column select line CSL. Memory cell MC is formed of an nMOS transistor having a gate electrode connected to word line WL and a capacitor.

FIG. 31 shows data line gate DG in detail. As illustrated in FIG. 31, data line gate DG is formed of nMOS transistors Q101, Q102, and pMOS transistors Q103, Q104 which electrically connect sub data line LDL and main data line GDL, and sub data line /LDL and main data line /GDL.

The operation of the configuration shown in FIGS. 29 to 31 will be described by way of illustrating a case in which the content of memory cell MC as shown in FIG. 30 is read out. Assume, for example, that row decoder RD1 is activated, word line WL11 is selected, and the column select line CSL11 of column decoder CD1 and the column select line SCL21 of column decoder CD2 are selected. Row decoder RD1 is activated, then row decoder RD1 outputs a high logic signal as a row select signal through word line WL11 in row block RB1. This activates memory cell MC connected to word line WL11, and the capacitor and bit line BL are turned on. Meanwhile, sense amplifier decoder SD1 corresponding to row decoder RD1 is activated in association with row decoder RD1, and sense amplifier circuit SA in the sense amplifier portion is activated through a signal line (not shown) in corresponding sense amplifier block SB1. Then, activated sense amplifier circuit SA amplifies a potential difference between bit lines BL and /BL connected thereto.

Then, high logic signals as column select signals are applied from column decoders CD1 and CD2 through column select signal lines CSL11 and CSL21, respectively. Thus, column gates CG111 and CG121 in the sense amplifier portions, respectively connected to column select signal lines CSL11 and CSL21 are turned on. The bit line pair and the sub bit line pair are electrically connected as a result. As the time, sub data lines LDL11, /LDL11 are connected to the amplified bit lines BL111 and /BL111, and sub data lines LDL12, /LDL12 are connected to the amplified bit lines BL121 and /LBL121. (Hereinafter a data line pair will be denoted only with LDL with /LDL being omitted. This applies to bit line pair BL, and main data line pair GDL). Meanwhile, no amplified signal will appear on other sub data line pairs whose sense amplifier circuits are not activated.

When a single data line gate DG11 provided for sense amplifier block SB1 and column block CB1, and a single data line gate DG21 provided for sense amplifier block SB1 and column block CB2 are provided with a high logic signal on block select signal line BS or a low logic signal on /BS through block select signal lines BS1, /BS1 from the common sense amplifier decoder SD1, sub data line pair LDL11 and main data line pair GDL11 are electrically connected as a result, and sub data line pair LDL12 and main data line GDL21 are electrically connected as well.

Thus, the data of memory cells connected to word line WL11 and to one bit line of bit line pair BL111 and one bit line of pair BL121 are output to an output circuit block (not shown) corresponding to main data line pair GDL11 in data line input/output circuit PW through sub data line pair LDL11, and main data line pair GDL11, respectively, and to an output circuit block (not shown) corresponding to main data line pair GDL21 in data line input/output circuit PW through sub data line pair LDL12 and main data line pair GDL21, respectively.

As described above, since in a conventional semiconductor memory device, in data reading, charges accumulated in one sub data line is discharged for one sense amplifier portion connected to one sub data line pair, and another sub data line paired therewith is charged from the sense amplifier portion, as the wiring length of the sub data pair increases, the floating capacitance of the wiring increases as well, and time required for charge/discharge increases, thus impeding high speed data transmission. In addition, power consumed for such charge/discharge increases as well. The same applies to any selected main data line, and thus power consumed by the entire semiconductor memory device increases. For expected increase in the storage capacity of semiconductor memory devices in the future, optimization of wiring arrangement for sub data lines or main data lines is a significant object.

More specifically, conventionally for the length of sub data lines in one sense amplifier corresponding to one column block (when 256 sense amplifier portions correspond to one column block), a length for connecting at least 256 sense amplifier portions is necessary. With increase in storage capacity, however, even advanced fine working techniques cannot prevent increase in the wiring length of sub data lines in a conventional arrangement in which sense amplifier portions are simply doubled, and column gates CD doubles, which increases floating capacitance or the like present in the sources/drains of transistors constituting the column gates. This impedes high speed data transmission and power consumption for charge/discharge of sub data lines inevitably increases.

With advancement of fine working techniques, memory cells may shrink in size in the future, but it would be difficult to improve the integration density of sense amplifier portions as much as memory cells shrink, for the complexity of the circuit configuration. A sense amplifier portion has an elongate shape in the direction of columns, and therefore increasing the numbers of row blocks and sense amplifier blocks corresponding to the row blocks increases the length in the direction of columns, which increases the wiring length of main data lines, and floating capacitance for the wiring increases as well, thus impeding high speed data transmission with power consumed for charge/discharge of main data lines increasing.

SUMMARY OF THE INVENTION

It is an object of the invention to provide a semiconductor memory device permitting high speed data transmission.

Another object of the invention is to provide a semiconductor memory device suitable for high density integration.

Yet another object of the invention is to provide a semiconductor memory device permitting reduction of power consumption by the device.

A still further object of the invention is to provide a semiconductor memory device capable of improving the reliability of storage data.

An additional object of the invention is to manufacture semiconductor memory devices depending upon objects such as reducing power consumption and improving yield.

A semiconductor memory device according to one aspect of the invention including a first memory cell group in which only one column is selected by a column decoder from a plurality of columns and the first memory cell group is divided into a plurality of second memory cell groups in the direction of columns. The device includes a plurality of sub data lines provided corresponding to each of the second memory cell groups. The column decoder is provided corresponding to the first memory cell group, and only a sub data line corresponding to such a second memory cell group having a column selected by the column decoder is precharged to a prescribed potential.

In the above-described configuration, a short sub data line is provided for every second memory cell group, the sub data line is precharged at a high speed, and high speed data transmission is enabled as a result.

A semiconductor memory device according to another aspect of the invention including a plurality of memory cell groups includes a plurality of sub data lines provided corresponding to each of the plurality of memory cell groups, a main data line selectively connected to the plurality of sub data lines, and an equalize circuit for equalizing the sub data lines. The equalize circuit equalizes the main data line in response to a first equalize signal based on a row address signal and a second equalize signal based on a column address signal.

In the above-described configuration, the equalize circuit operates in response to the first equalize signal based on a row address signal and the second equalize signal based on a column address signal, and therefore the equalizing timing for sub data lines can be well matched with the operation timing of a column select line operating in response to the column address signal, idle time in operation is eliminated, in other words high speed operation is enabled, and high speed data transmission can be achieved.

A semiconductor memory device according to another aspect of the invention including a plurality of memory cell groups includes a plurality of sub data lines provided corresponding to each of the plurality of memory cell groups, a main data line provided corresponding to the plurality of sub data line, and a switch circuit for connecting the plurality of sub data lines and the main data line. In a usual operation of the semiconductor memory device, the switch circuit selectively connects the plurality of sub data lines to the main data line, and in a refresh mode operation of the semiconductor memory device, the switch circuit disconnects the plurality of sub data lines and the main data line.

In the above-described configuration, in a refresh mode in which data is not externally read out, it is not necessary to read out data onto the sub data lines and the main data line, which eliminates the necessity of precharging the sub data lines, and therefore power consumed by the device can be reduced.

A semiconductor memory device according to yet another aspect of the invention includes a plurality of memory blocks disposed in one column in the direction of columns, first and second column decoders for selecting a plurality of columns of memory blocks, and a select circuit for selecting different memory blocks among the plurality of memory blocks for two columns selected by the first and second column decoders, and reading out data from the selected memory blocks.

In the above-described configuration, the first and second column decoders will not read out data from the same memory block, a plurality of bit errors are not encountered, and the reliability of storage data can be improved.

A semiconductor memory device according to an additional aspect of the invention including a plurality of memory cell groups includes a plurality of sub data lines provided corresponding to each of the plurality of memory cell groups, a main data line provided corresponding to the plurality of sub data lines, a plurality of switch circuits for connecting the plurality of sub data lines and the main data line, and a plurality of equalize circuits for equalizing sub data lines. The plurality of switch circuits and equalize circuits previously disposed on the semiconductor substrate are selectively connected to the sub data lines.

In this configuration, the sub data lines can be connected to a desired switch circuit and a desired equalize circuit, and therefore semiconductor memory devices can be separately manufactured depending upon objects such as reducing power consumption and improving yield.

A semiconductor memory device according to a still further aspect of the invention includes a plurality of memory cell groups includes a plurality of sub data lines provided corresponding to each of the plurality of memory cell groups, a main data line provided corresponding to the plurality of sub data lines, and a switch circuit for connecting the plurality of sub data lines and the main data line. The sub data lines are precharged by the potential of the main data line through the switch circuit.

Thus, the circuit configuration is simplified and high density integration of devices can be implemented.

A semiconductor memory device according to a still further aspect of the invention including a first memory cell group in which only one of a plurality of columns is selected by the column decoder and the first memory cell group is divided into a plurality of second memory cell groups in the direction of columns. The device includes a plurality of sub data lines provided corresponding to the second memory cell groups. The column decoder is provided corresponding to the first memory cell group, and the semiconductor memory device further includes a main data corresponding to the plurality of sub data lines.

In the above configuration, short sub data lines produced by dividing for the second memory cell groups are provided, the sub data lines can be precharged at a high speed, and therefore high speed data transmission is enabled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
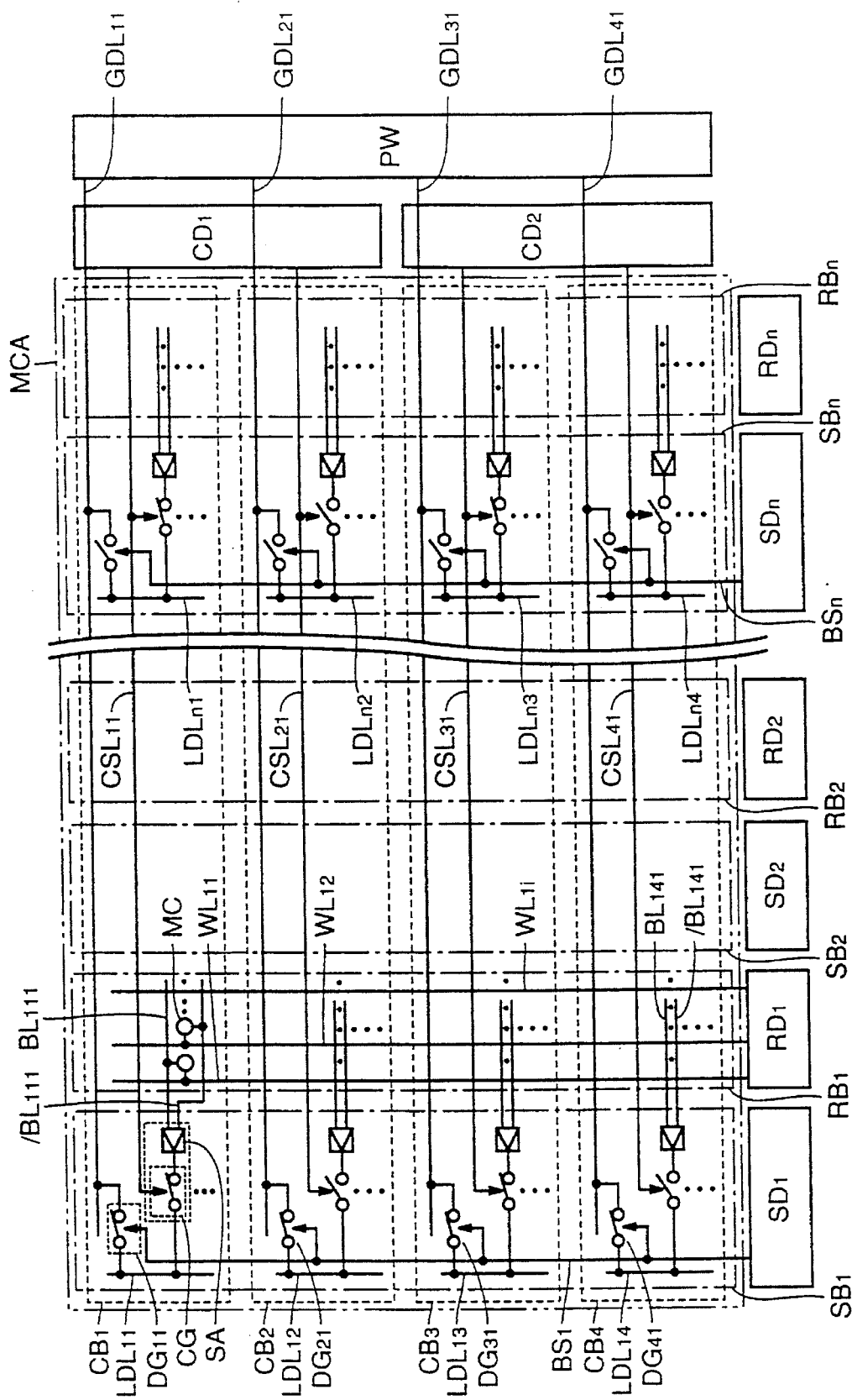
FIG. 1 is a diagram showing the configuration of a memory cell array in a dynamic RAM according to a first embodiment of the invention.

One embodiment of the present invention will be now described in conjunction with FIG. 1. FIG. 1 is a diagram showing the configuration of a memory cell array in a dynamic RAM as an example of a semiconductor memory device.

In FIG. 1, MCA is a memory cell array, RD1 to RDn are row decoders activated in response to a row address signal for outputting a row select signal for one of a plurality of word lines WL, RB1 to RBn are row blocks provided corresponding to RD1 to RDn, respectively and receiving the row select signal through word line WL, CD1 and CD2 are column decoders provided with a plurality of column select signal lines CSL for outputting a column select signal for one column select signal line among them in response to a column address signal, CB1, CB2, and CB3, CB4 are column blocks provided corresponding to CD1 and CD2, respectively for receiving the column select signal through column select line CSL, SD1 to SDn are sense amplifier block decoders provided corresponding to RD1 to RDn, respectively for outputting a block select signal when a corresponding row decoder is activated and outputs a row select signal to a row block, and SB1 to SBn are sense amplifier blocks provided corresponding to SD1 to SDn, respectively for receiving the block select signal through block select signal lines BS, /BS. Note that only one of block select signal lines BS, /BS is shown for the purpose of simplification.

Row blocks RB1 to RBn are each provided with a plurality of word lines WL disposed in the direction of rows, and a plurality of memory cells MC are connected to each word line WL in the direction of rows. The plurality of memory cells MC are each connected with one of bit lines BL, /BL, and a pair of bit lines BL, /BL are provided for a corresponding sense amplifier block and disposed in the direction of columns. Bit line pair BL is provided corresponding to column select line CSL in the direction of columns.

Sense amplifier blocks SB1 to SBn are provided with a sense amplifier portion. The sense amplifier portion has a sense amplifier circuit SA connected to one bit line pair BL in a corresponding row block and responsive to an activation signal (not shown) from a corresponding sense amplifier decoder SD for amplifying a potential difference between bit lines BL and /BL connected thereto, and a switch CG (hereinafter referred to as column gate) for electrically connecting bit line pair BL which is connected to sense amplifier circuit SA to sub data line pair LDL in response to a column select signal received through the column select line CSL of a corresponding column decoder CD. Note that only one of such sub data lines LDL is shown for the purpose of simplification.

One column block CB includes sub data line pairs LDL corresponding in number to sense amplifier blocks SB, and a switch DG (hereinafter referred to as data line gate) corresponding in number to sense amplifier blocks SB for connecting sub data line pair LDL to main data line pair GDL. Note that only one of such main data lines GDL is shown for the purpose of simplification.

Each main data line pair GDL is connected to a circuit block (not shown) corresponding to the data line pair in data line input/output circuit PW including a preamplifier and a write circuit.

The operation of the configuration in FIG. 1 will be now described. Row decoder RD1 is activated, and a high logic signal as a row select signal is applied through word line WL11 in row block RB1 corresponding to row decoder RD1. Therefore, a memory cell MC connected to word line WL11 is activated, and the capacitor and bit line BL are turned on. Meanwhile, a sense amplifier decoder SD1 corresponding to row decoder RD1 is activated in association with row decoder RD1, and a sense amplifier circuit SA in a sense amplifier portion in corresponding sense amplifier block SB1 is activated through a signal line (not shown). A potential difference between bit lines BL and /BL connected to thus activated sense amplifier circuit SA is amplified.

Then, high logic signals as column select signals are applied from column decoders CD1 and CD2 through column select signal lines CSL11 and CSL31, respectively. Thus, column gates CG in the sense amplifier portions connected to column select signal lines CSL11 and CSL31 are turned on. Then, the bit line pair and the sub data line pair are electrically connected. At the time, sub data line pair LDL11 is connected to thus amplified bit line pair BL111, and sub data line pair LDL13 is connected to bit line pair BL131. Sense amplifier circuits to which the other sub data line pairs are connected are not activated.

Sub data line pair LDL11 and main data line pair GDL11 are electrically connected in response to a high logic signal output on block select signal line BS or a low logic signal output on /BS through block select signal line BS1, /BS1 from a common sense amplifier decoder SD1 for single data line gate DG11 for sense amplifier block SB1 and column block CB1, single data line gate DG21 for sense amplifier block SB1 and column block CB2, single data line gate DG31 for sense amplifier block SB1 and column block CB3, and single data line gate DG41 for sense amplifier block SB1 and column block CB4. At the time sub data line pair LDL12 and main data line GDL are electrically connected, sub data line pair LDL13 and main data line pair GDL31 are electrically connected, and sub data line pair LDL14 and main data line GDL41 are electrically connected. However, sub data line pair LDL12 and main data line GDL21, and sub data line pair LDL14 and main data line GDL41 are not connected to any bit line pair, and therefore their data is not transmitted and remains unused.

Thus, the data of memory cells connected to word line WL11 and to one bit line of bit line pair BL111 and one bit line of bit line pair BL131 are output through sub data line pair LDL11 and main data line pair GDL11, respectively to an output circuit block (not shown) corresponding to main data line pair GDL11 in data line input/output circuit PW, and to an output circuit block (not shown) corresponding to main data line pair GDL31 in data line input/output circuit PW through sub data line pair LDL13, main data line pair GDL31.

As described above, since a plurality of column blocks are provided for one column decoder and a sub data line pair and a data line gate for electrically connecting the sub data line pair and a main data line pair are provided at every crossing region of each column block and each sense amplifier block, sub data line pairs in column blocks which do not receive any column select signal do not consume power necessary for charge/discharge for reading data, and therefore power consumption is reduced. Furthermore, since increase of the wiring length of sub data line pairs according to increase in storage capacity can be restrained, which restrains increase in floating capacitance, and a device suitable for high speed data transmission is obtained.

Second Embodiment

Figure 2:
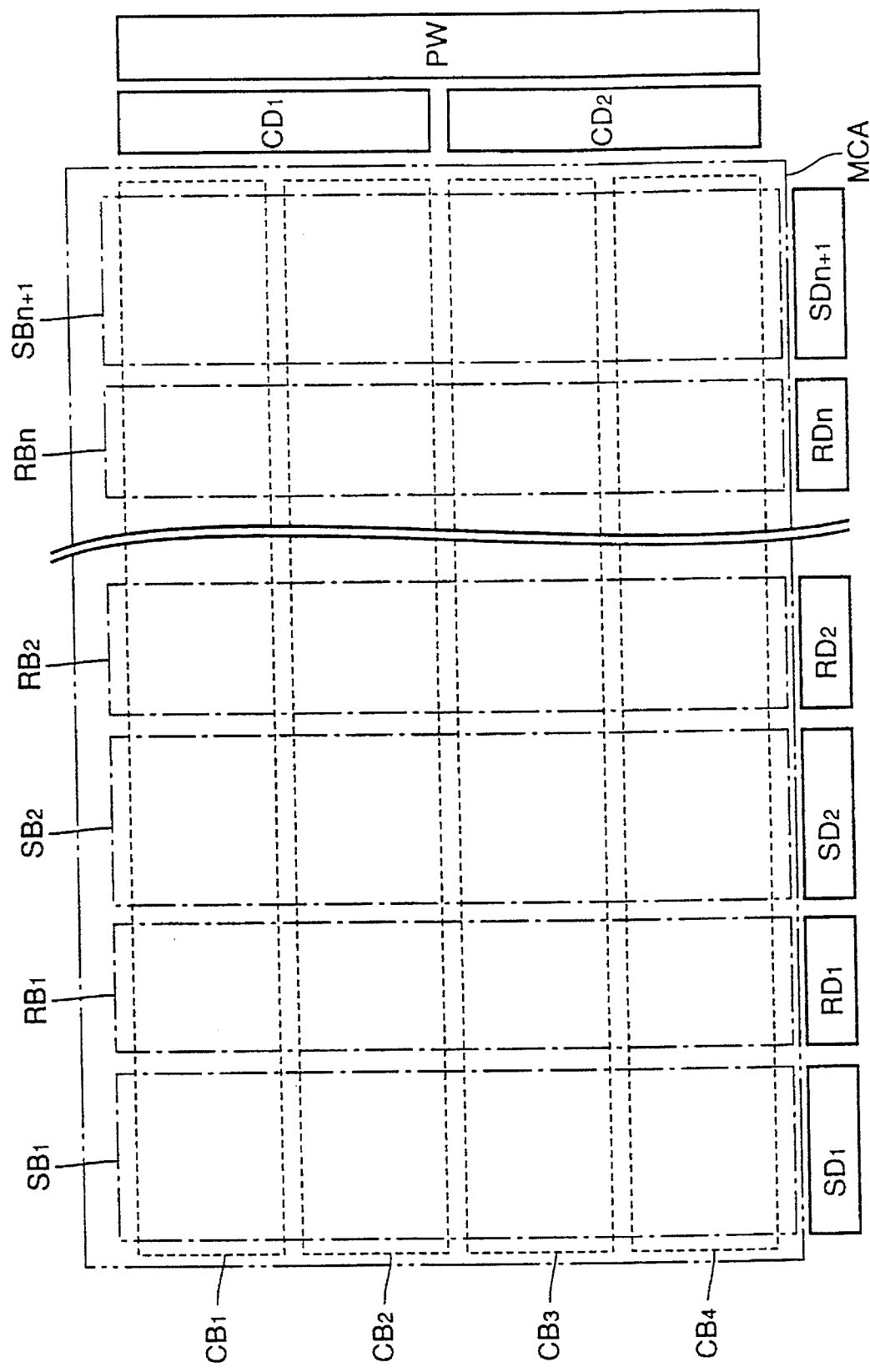
FIG. 2 is a diagram showing the configuration of a memory cell array in a dynamic RAM according to a second embodiment of the invention.
Figure 3:
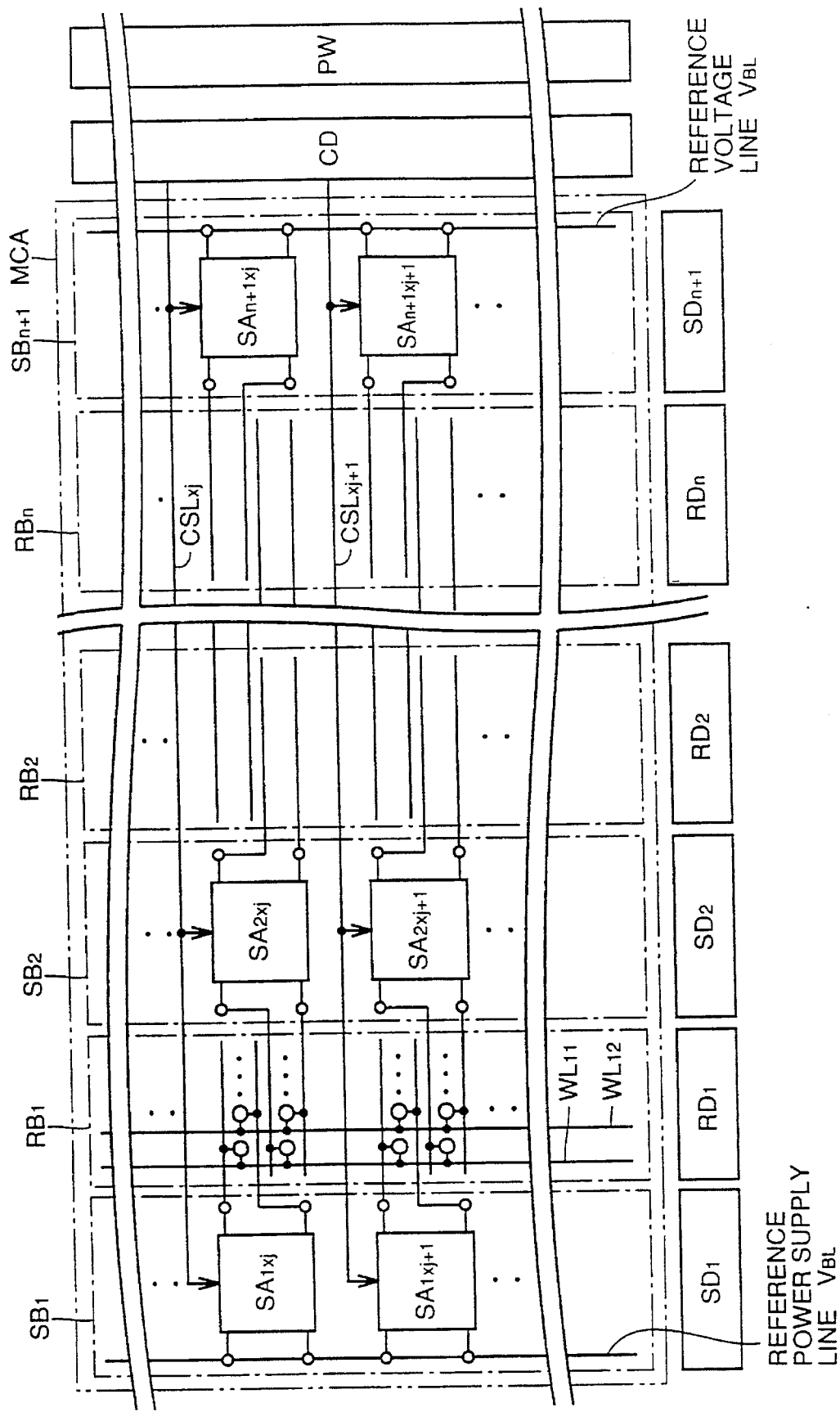
FIG. 3 is a diagram showing how bit line pairs and sense amplifier portions are disposed in the memory cell array shown in FIG. 2.

In FIGS. 2 and 3, sense amplifier block SB in the first embodiment is shared between right and left column blocks RB, and memory cells in column block RB are alternately arranged for right and left sense amplifier blocks SB.

More specifically, bit line pairs are arranged in the direction of columns from sense amplifier portions SA2xj, SA2xj+1 ... (x is a number for corresponding column block) in sense amplifier block SB2 toward left and right row blocks RB1 and RB2. Note however that bit line pairs are not connected to the left of sense amplifier block SB1 and to the right of sense amplifier block SBn+1. In the case, the bit line connection node may be rendered open, but is preferably connected to a reference potential line VBL to be at ½ VCC. Switches for changing the connection of the bit line pairs on the left and right (not shown) are provided in the sense amplifier portions, and a switch which is not connected to a bit line pair is always in an off state.

In row block RB1 as shown, memory cells connected to left and right sense amplifier blocks are arranged alternately in the direction of columns.

The relations between row blocks RB and sense amplifier blocks SB will be now described. If, for example, row decoder RD1 is activated, corresponding sense amplifier decoders SD1 and SD2 are activated and output activation signals to corresponding sense amplifier blocks SB1 and SB2, respectively, and a sense amplifier circuit in each sense amplifier portion is activated as a result.

Figure 4:
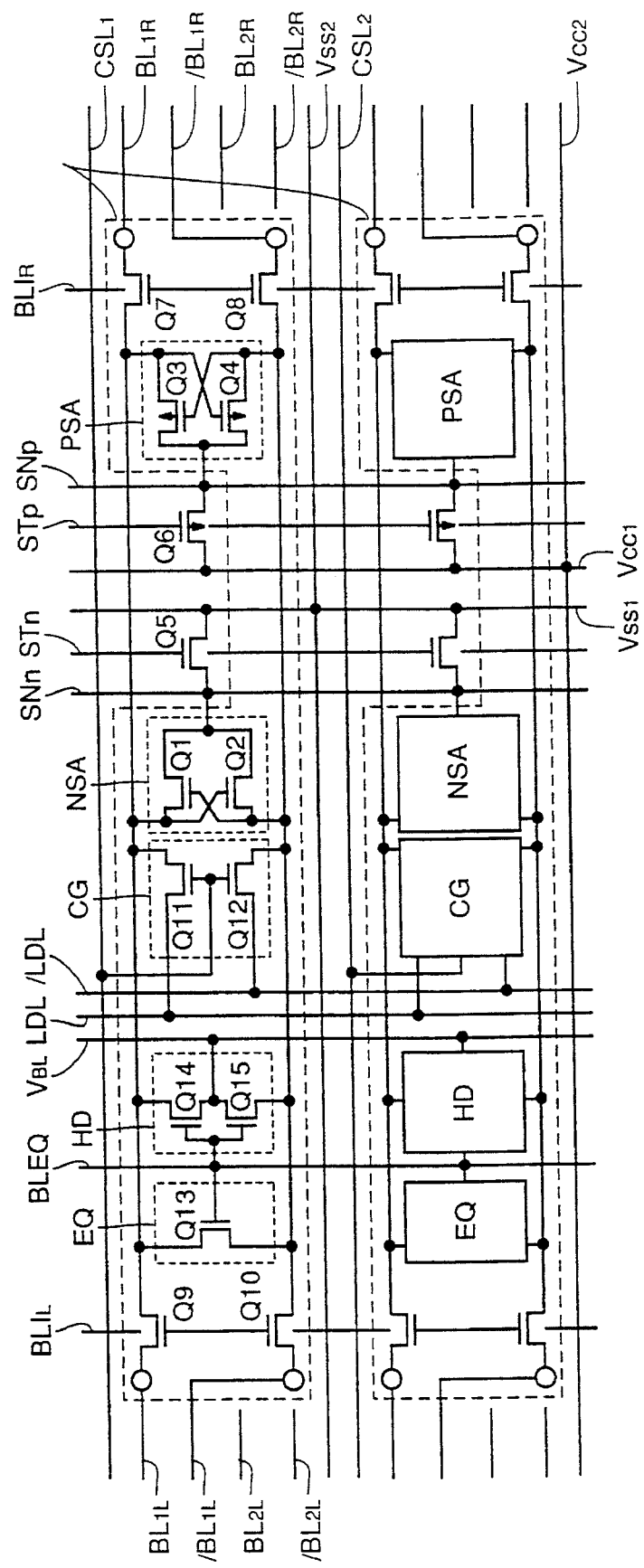
FIG. 4 is a diagram showing the configuration of the sense amplifier block portion in the memory cell array in FIG. 3.

More specifically, referring to FIG. 4 showing the configuration of the sense amplifier portion in detail, $BL^{1R}$, $\overline{BL^{1R}}$, $BL^{2R}$, $\overline{BL^{2R}}$ are bit lines belonging to memory cell blocks on the right, $BL^{1L}$, $\overline{BL^{1L}}$, $BL^{2L}$, $\overline{BL^{2L}}$, ... are bit lines belonging to memory cell blocks on the left. NSA formed of transistors Q1 and Q2 is an n channel sense amplifier circuit, PSA formed of transistors Q3 and Q4 is a p channel sense amplifier circuit, transistors Q5 and Q6 are an n channel sense amplifier drive transistor and a p channel sense amplifier drive transistor, respectively, transistors Q7 and Q8 are right bit line separation transistors, transistors Q9 and Q10 are left bit line separation transistors, CG formed of transistors Q11 and Q12 is a column gate, EQ formed of a transistor Q13 is a bit line equalizer, HD formed of transistors Q14 and Q15 is a bit line potential hold circuit, LDL and /LDL are sub data lines, SNn and SNp are common source lines for n channel and p channel sense amplifiers, respectively, STn and STp are n channel and p channel sense amplifier drive signal interconnections, respectively, BLEQ is a bit line equalize signal interconnection, VBL is a bit line hold potential interconnection and BLIR and BLIL are right and left bit line separation signal interconnections, respectively. BLIR is connected to the gates of transistors Q7 and Q8, BLIL is connected to the gates of transistors Q9 and Q10. When the sense amplifier portion is provided in SB1, BLIL is grounded, thus always keeping transistors Q9 and Q10 in a non-conduction state, while if the sense amplifier portion is provided in SBn+1, BLIR is grounded, thus always keeping transistors Q7 and Q8 in a non-conduction state. CSL1 and CSL2 are column select lines, Vss1 and Vss2 are ground potential interconnections, and Vcc1 and Vcc2 are power supply potential interconnections.

More specifically, in response to STn and STp as activation signals for sense amplifier circuits received at the sense amplifier portion from sense amplifier decoder SD, BLIR and BLIL select a row block corresponding to a row decoder being activated. If, for example, row decoder RD1 is activated, sense amplifier decoders SD1 and SD2 are activated, and the activation signals output from SD1 and SD2 are output as sense amplifier drive signals through STn and STp to sense amplifier circuits in corresponding sense amplifier blocks, respectively. At the time, a bit line in row block RB1 and the sense amplifier portion is connected by outputting a bit line separation signal through BLIL to sense amplifier block SB1, while a bit line in row block RB1 and the sense amplifier portion are connected by outputting a bit line separation signal through BLIR to sense amplifier block SB2. If the sense amplifier circuits are not activated, BLIR and BLIL are both inactivated, BLEQ is activated, and the bit line pair is connected to reference potential line BVL to be fixed at ½ VCC. The arrangement of data lines in the memory cell array according to this embodiment will be now described.

Figure 5:
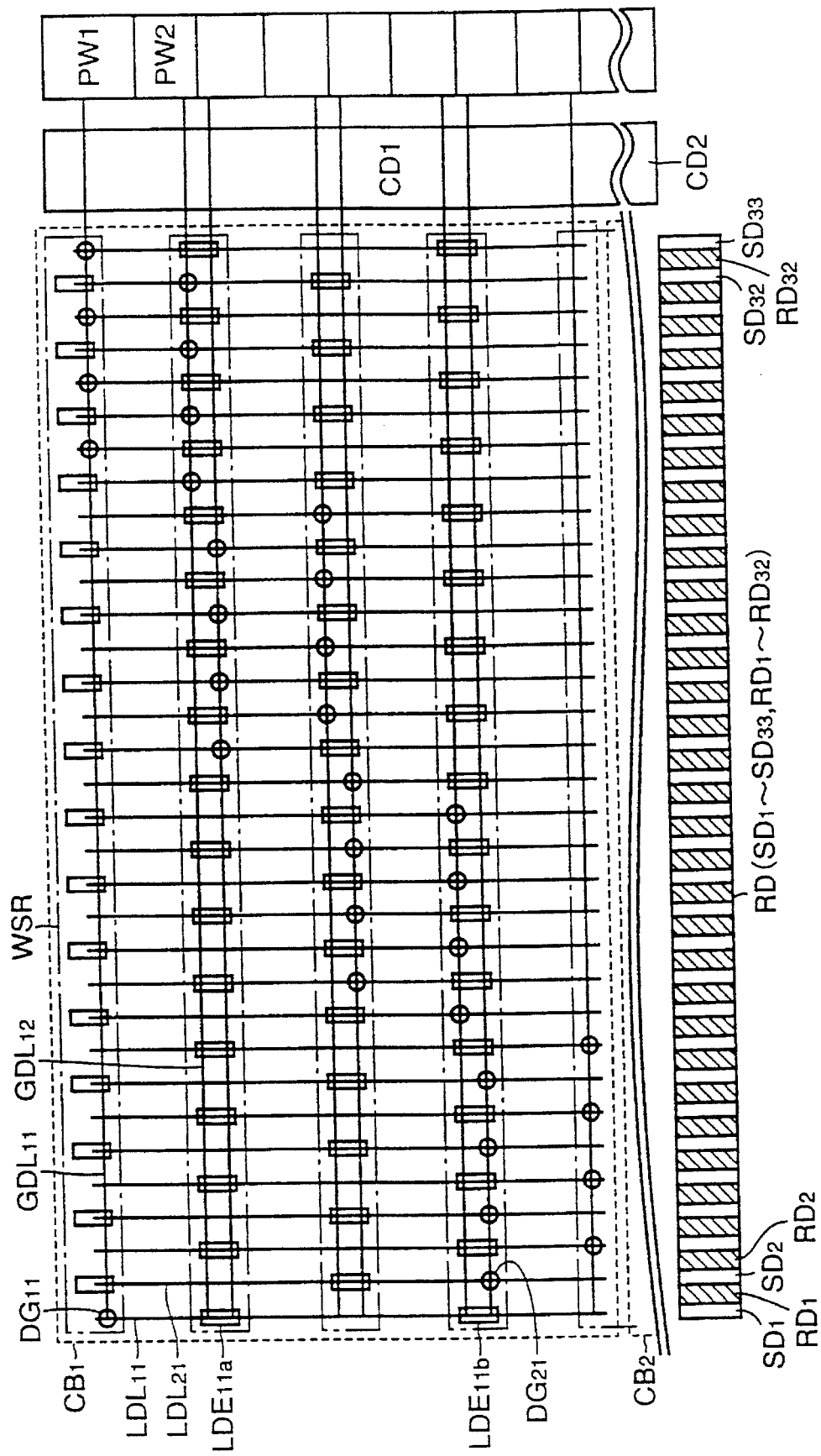
FIG. 5 is a diagram showing the arrangement of data lines in a memory cell array.

FIG. 5 shows the arrangement of the data lines in the memory cell array, especially showing the arrangement in column block CB1. In FIG. 5, LDL11, LDL21, ... are sub data lines, GDL11, GDL12, ... are main data lines, DG11, DG21, ... are data line gates, LDE11a, LDE11b, ... are sub data line equalizers, CD1 is a column decoder, and PW11, PW12, ... are data line input/output circuits including a preamplifier and a write circuit. Although sub data lines and main data lines are provided in pairs, only one of each is shown for the purpose of simplification. Main data lines GDL11, GDL12, ... are provided in a word line shunt region WSR. The length of one sub data line is the sum of the length of four regions having memory cells disposed therein and the length of about four word line shunt regions WSR. Accordingly, considering repeatedly provided column blocks, a sub data line crosses five word line shunt regions. As illustrated, a data line gate is connected to one of the crossings, and sub data line equalizes are provided at other two crossings. Connecting a plurality of sub data line equalizers to one sub data line permits the sub data line to be equalized at a high speed.

Figure 6:
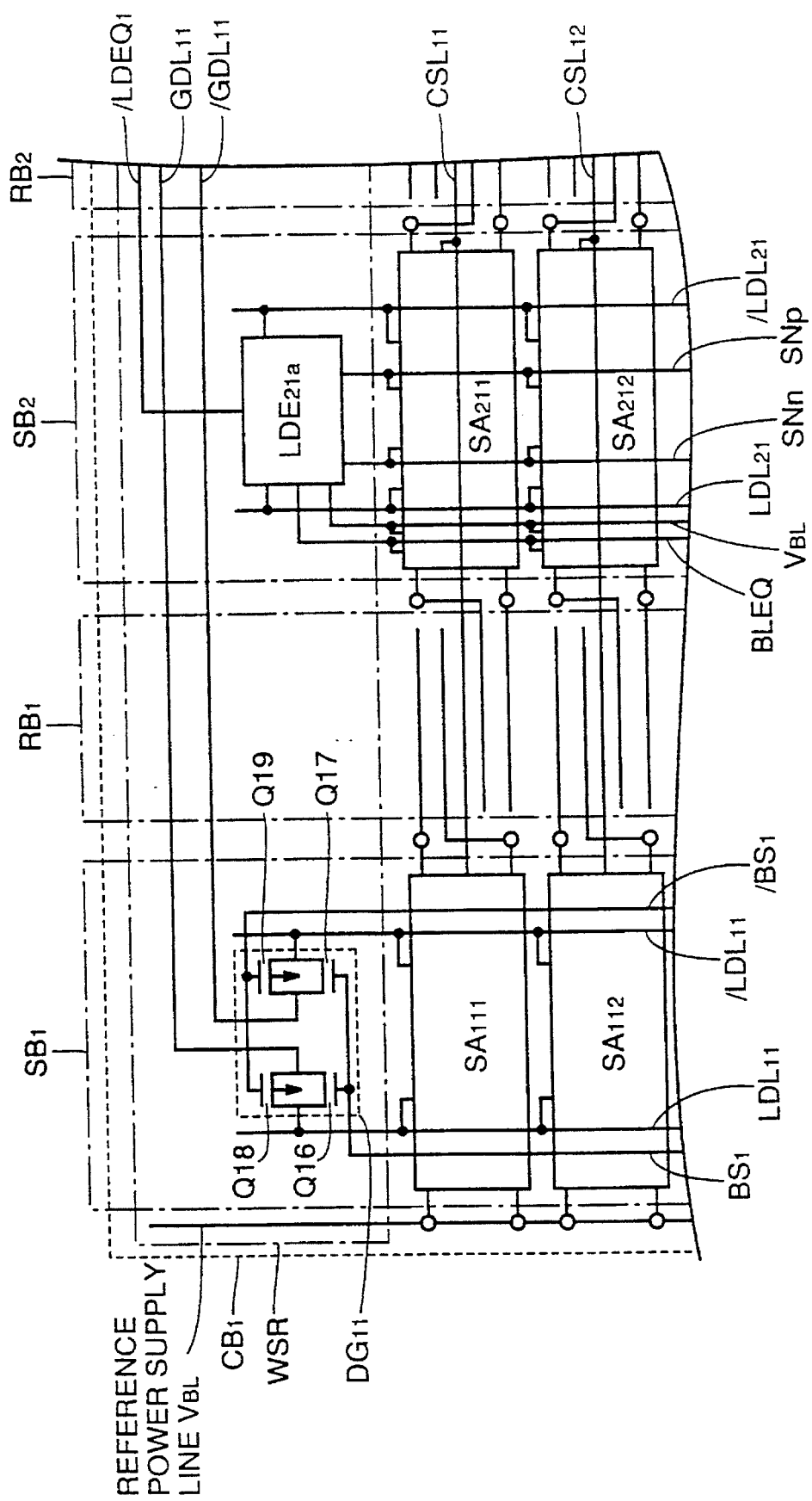
FIG. 6 is a diagram showing the configuration of a data line gate portion in the memory cell array shown in FIG. 5.

FIG. 6 shows in detail part of FIG. 5, illustrating the configuration and arrangement of data line gate DG and the disposition of sub data line equalizer LDE. In FIG. 6, transistors Q16 to Q19 are transistors to form CMOS data line gates, LDL and /LDL are sub data lines, GDL and /GDL GDL are main data lines, and BS and /BS are block select signal interconnections.

Figure 7:
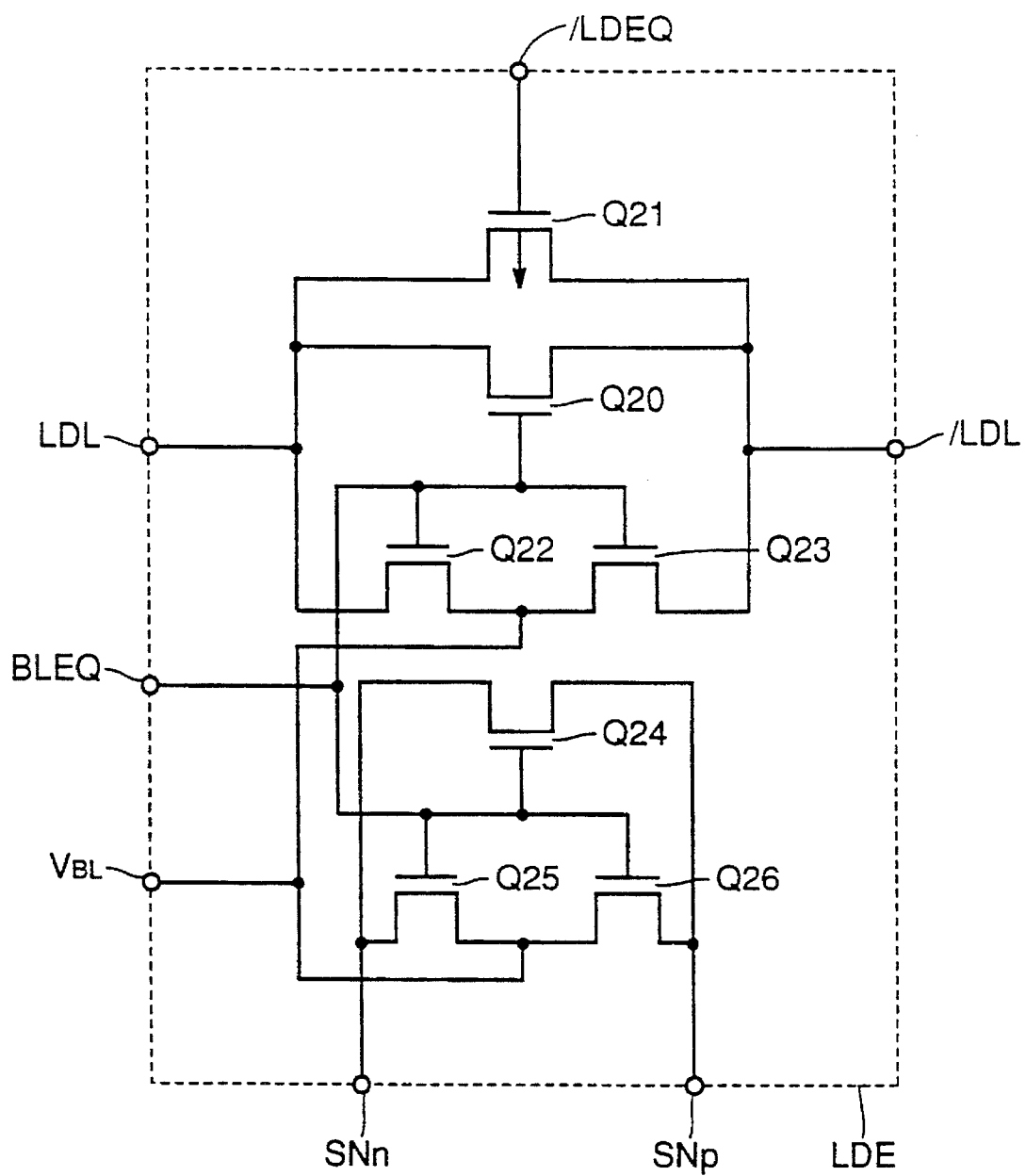
FIG. 7 is a diagram showing the configuration of a sub data line equalizer portion in the memory cell array shown in FIG. 6.

FIG. 7 is a diagram showing the configuration of sub data line equalizer LDE. In FIG. 7, transistor Q20 equalizes a sub data line pair in response to a bit line equalize signal BLEQ, transistor Q21 equalizes a sub data line pair in response to a sub data line equalize signal /LDEQ, and Q22 and Q23 are sub data line potential hold transistors. Provided in addition to the transistors described above are transistors Q24 to Q26 for equalizing the potentials SNn and SNp of n channel and p channel sense amplifier common sources in the sub data line equalizer portion and holding the potentials.

As illustrated in FIGS. 6 and 7, by sub data line equalizer LDE, sub data lines are equalized by a transistor controlled by bit line equalize signal BLEQ and a transistor controlled by sub data line equalize signal /LDEQ. The bit line equalize signal is inactivated in response to a selection of a sense amplifier block with a row address. Meanwhile, the sub data line equalize signal operates in response to a column address signal. Since a column select line also operates in response to the column address signal, and therefore supplying the sub data line equalize signal and the column select signal from the same side with respect to the memory cell array (from the right in this case) in the same interconnection layer (a second metal interconnection in this case) permits timings for the sub data line equalize signal and the column select signal to be readily matched.

Figure 8:
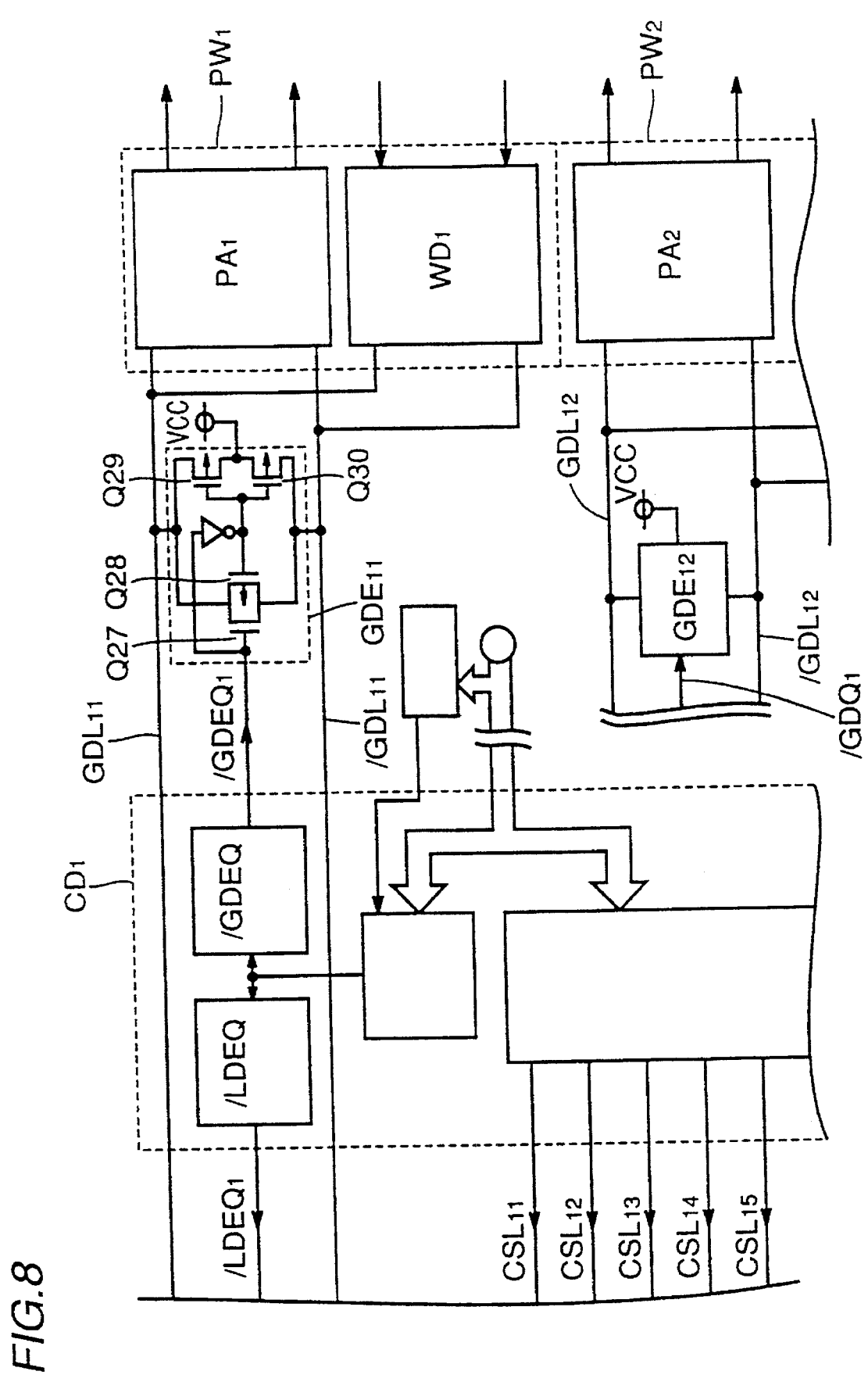
FIG. 8 is a diagram showing the configuration of a data line input/output circuit portion.

FIG. 8 shows in detail data line input/output circuit PW, a generator for generating sub data line equalize signal /LDEQ, and a generator for generating main data line equalizer GDE and main data line equalize signal /GDEQ. As illustrated, in the data input/output circuit portion, a pair of preamplifier PA and write driver WD is provided for each main data line pair. One main data line pair is also provided with one main data line equalizer GDE, and unused main data line pairs GDL in column blocks are precharged to power supply potential Vcc based on main data line equalize signal /GDEQ.

In the circuit configuration of main data line equalizer GDE, transistors Q27 and Q28 equalize main data lines GDL and /GDL, while transistors Q29 and Q30 precharge main data lines GDL and /GDL to power supply potential Vcc.

Sub data line equalize signal /LDEQ is output from the /LDEQ generator. The /LDEQ generator determines whether or not a column block is being used under, the control of an equalize enable circuit receiving a detection signal from an ATD circuit for detecting a change of a column address and a column address input. If column select signal line CSL in a column block is not activated, the column block does not transmit/receive data, equalize signal /LDEQ is generated to a sub data equalizer LDE provided for each sub data line pair, in order to equalize the sub data line pair in the column block unused. In addition, sub data line equalize signal /LDEQ is input to each sub data line equalizer LDE in a corresponding column block through a sub data line equalize signal line for every word shunt region WSR.

Main data signal equalize signal /GDEQ is output from the /GDEQ generator. The /GDEQ generator determines whether or not a column block is being used, under the control of the equalize enable circuit receiving a detection signal from the ATD circuit for detecting a change of a column address and a column address input. If column select signal line CSL in a column block is not activated, the column block does not transmit/receive data. At the time, main data line equalize signal /GDEQ is generated to the main data line pair in the column block. In addition, main data line equalize signal /GDEQ is input to each main data line equalizer GDE through one main data line equalize signal line for every main data line pair.

Figure 9:
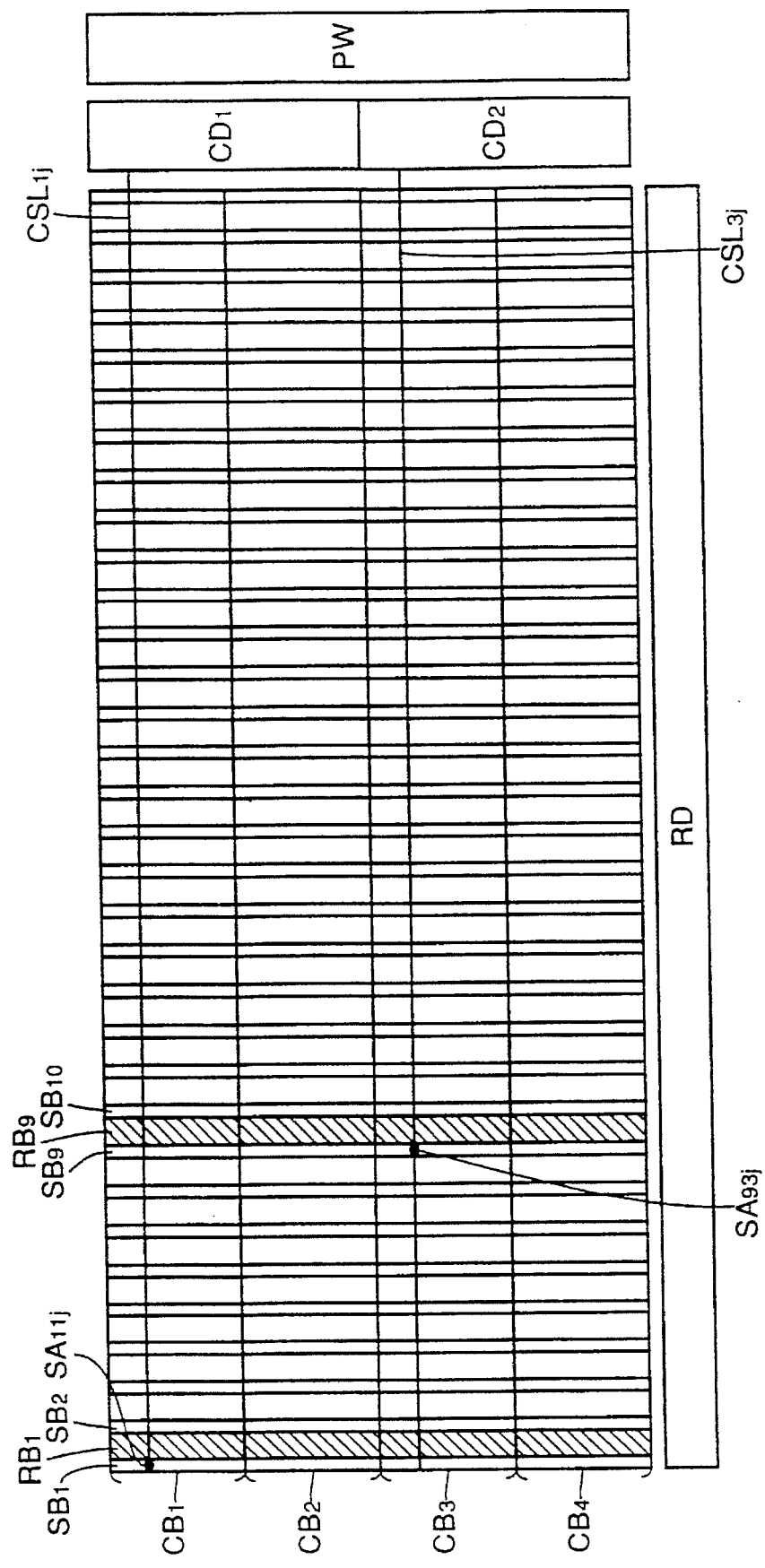
FIG. 9 is a diagram showing a position to select two bits at a time from the memory cell array shown in FIG. 5.
Figure 10:
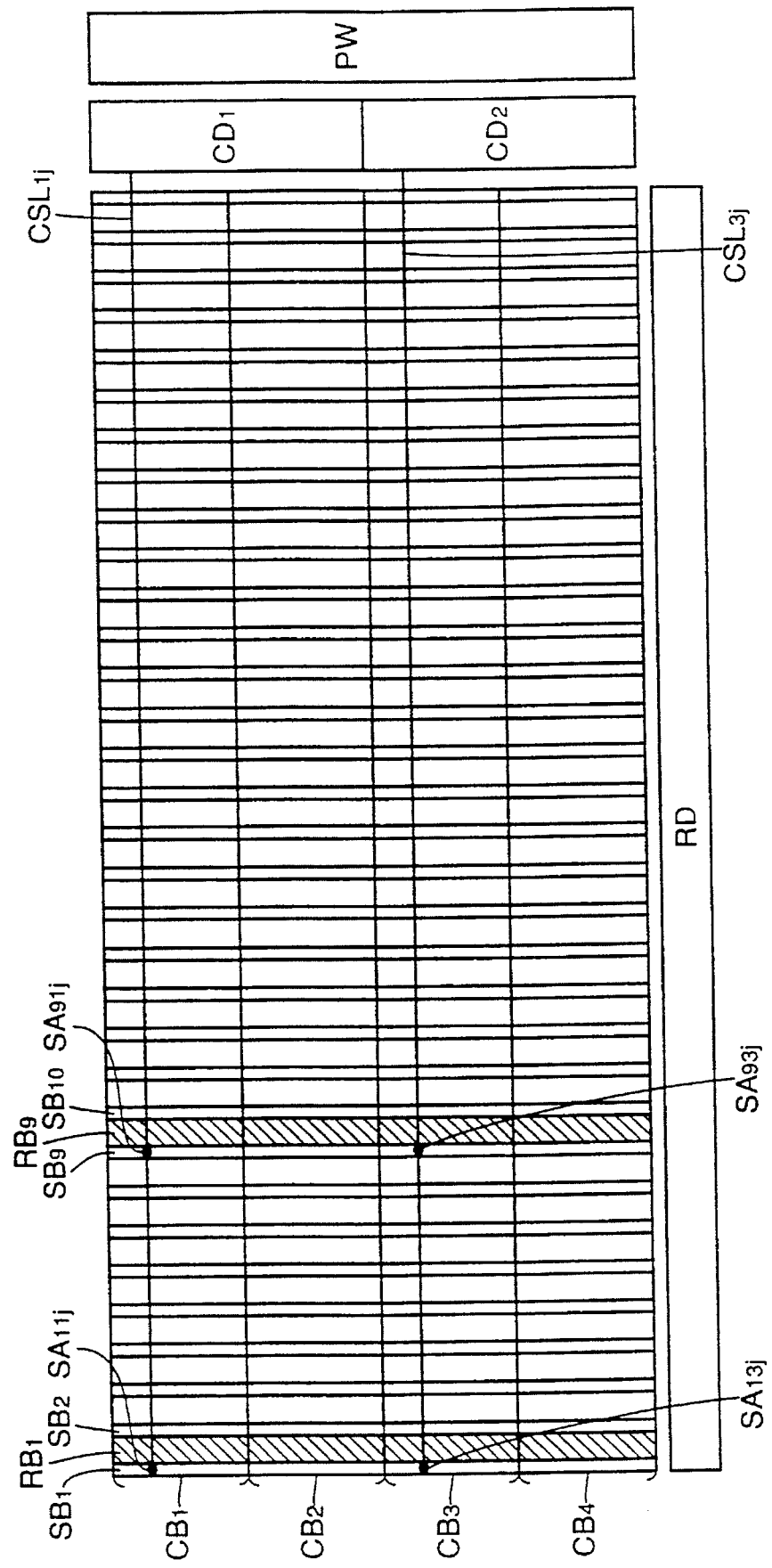
FIG. 10 is a diagram showing a position to select four bits at a time from the memory cell array shown in FIG. 5.
Figure 11:
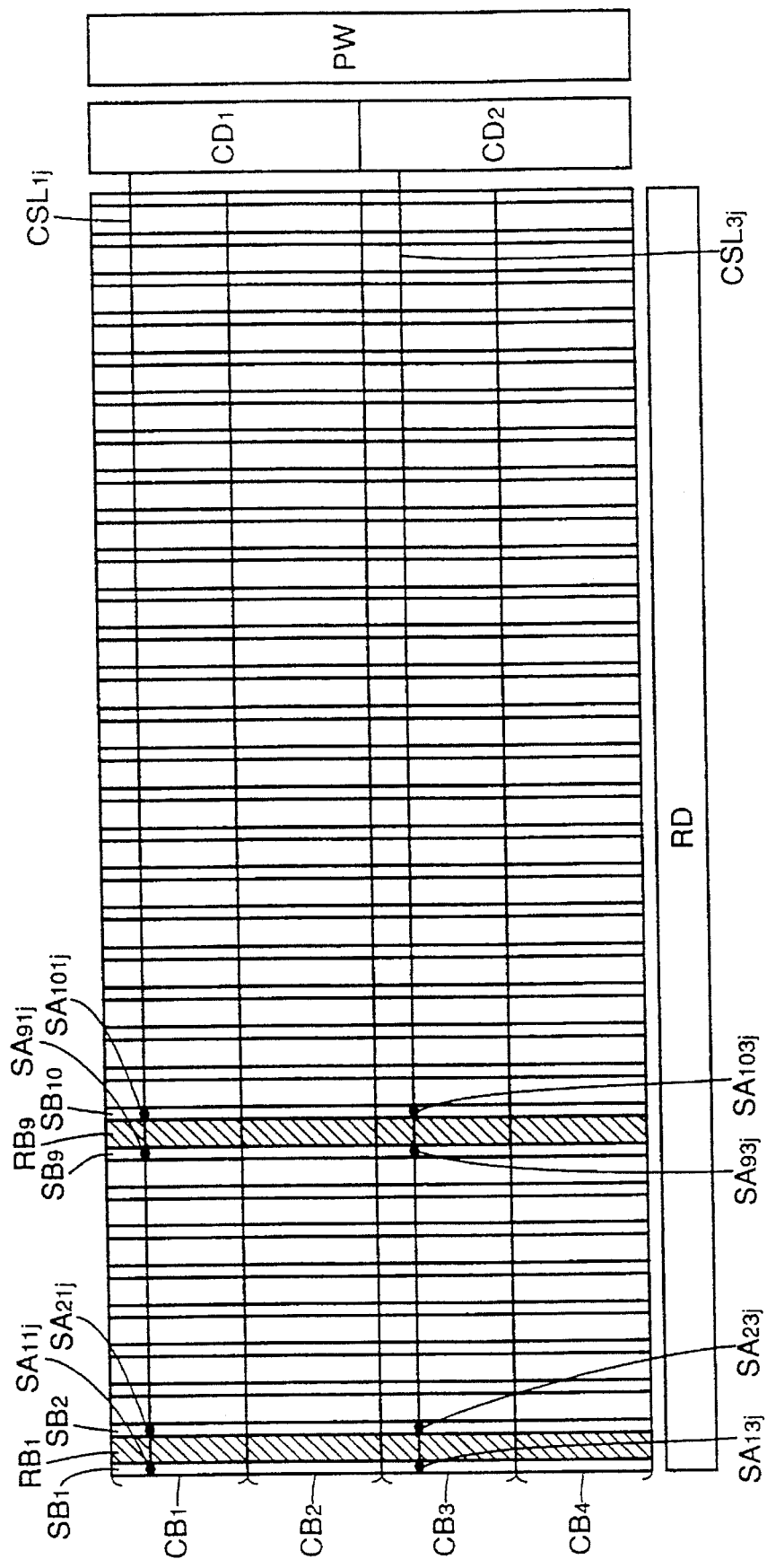
FIG. 11 is a diagram showing a position to select eight bits at a time from the memory cell array shown in FIG. 5.

FIGS. 9 to 11 show positions to select a plurality of bits at a time from one memory cell array. In the figures, RB1, RB2, ... are row blocks, SB1, SB2, ... are sense amplifier blocks, and CSL1j and CSL3j are column select lines selected at a time.

FIG. 9 shows positions to select two bits at a time from one memory cell array. Among the crossings of sense amplifier blocks SB1, SB2, SB9 and SB10 corresponding to row blocks RB1 and RB9 selected simultaneously and column select lines CSL1j and CSL3j selected simultaneously, one bit is each selected from a crossing of one row block and one column select line and a crossing of another row block and the other column select line (such as a crossing of sense amplifier block SB1 and column select line CSL1j, and a crossing of sense amplifier block SB9 and column select line CSL3j). Thus, an error of one word line or column select line will not cause an error of a plurality of bits at a time, and therefore the reliability of storage data in the semiconductor memory device increases.

FIG. 10 shows positions to select 4 bits at a time from one memory cell array. 1 bit is each selected from crossings of sense amplifier block SB1 and column select lines CSL1j and CSL3j, and crossings of sense amplifier block SB9 and column select lines CSL1j and CSL3j.

FIG. 11 shows positions to select 8 bits at a time from one memory cell array. 1 bit is each selected from crossings of sense amplifier block SB1 and column select lines CSL1j and CSL3j, crossings of sense amplifier block SB2 and column select lines CSL1j and CSL3j, crossings of sense amplifier block SB9 and column select lines CSL1j and CSL3j, and crossings of sense amplifier block SB10 and column select lines CSL1j and CSL3j.

Figure 12:
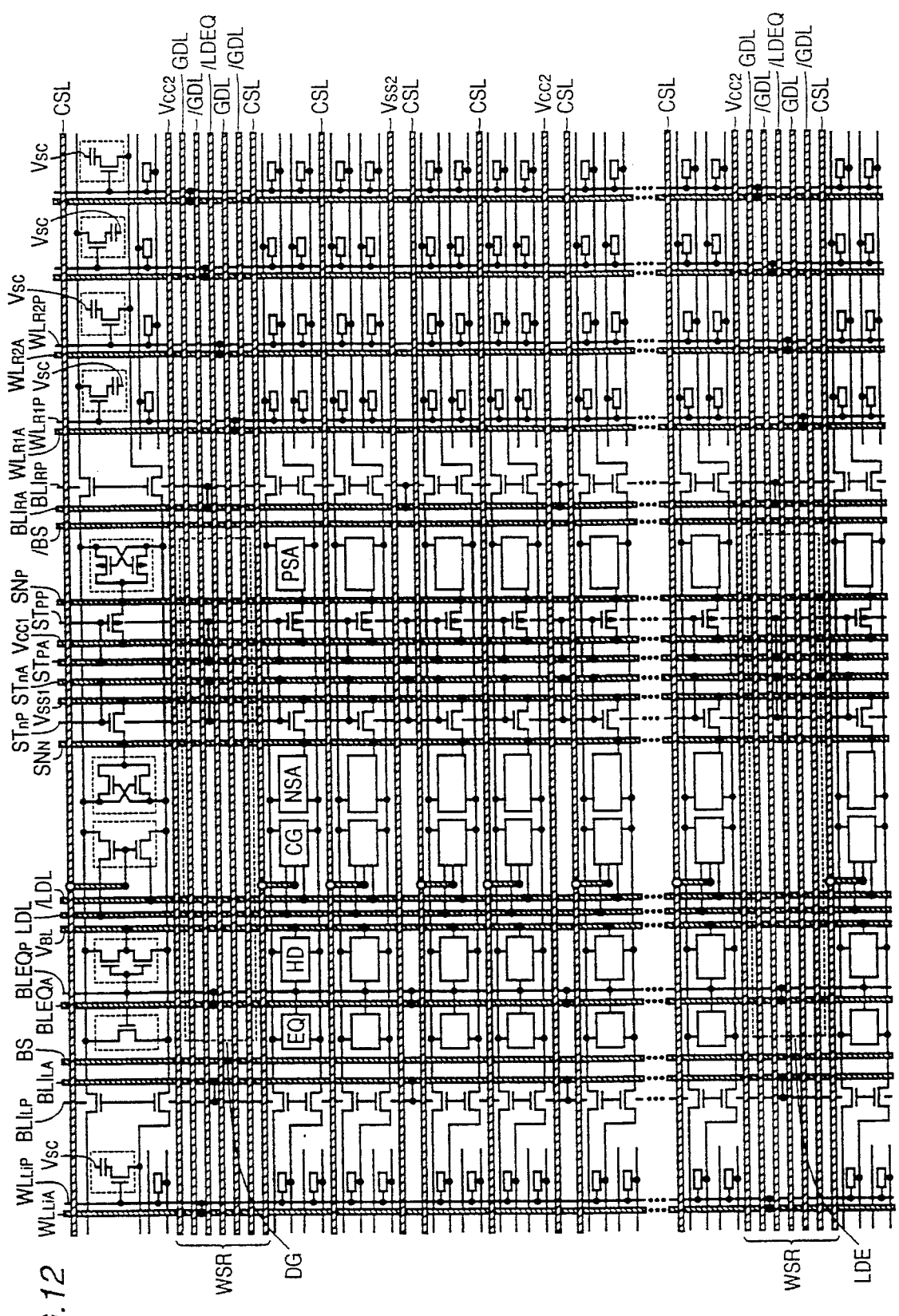
FIG. 12 is a diagram showing the circuit configuration and pattern layout of the sense amplifier block portion in the memory cell array shown in FIGS. 2 and 3.

FIG. 12 shows the circuit configuration and pattern layout of the sense amplifier block portion. In FIG. 12, the interconnection hatched at wide intervals extending in the longitudinal direction is formed of a first metal interconnection, and the interconnection hatched at wide intervals extending in the transverse direction is formed of a second metal interconnection. Interconnections of polysilicon or polycide (a double layer of polysilicon and metal silicide) are depicted in solid line. More specifically, WLR1P, WLR2P, . . . are word lines of polycide, WLR1A, WLR2A, . . . are word lines of the first metal interconnections. Word lines of the first metal interconnections and corresponding word lines of polycide are connected in word line shunt region WSR. In FIG. 12, though they are provided in parallel to each other, at at least connection points, they are placed upon each other hierarchically, and the first metal interconnections are connected to polycide through contact holes provided in an insulating layer which is not shown.

Bit line equalize signal BLEQ, right and left bit line separation signals BLIR and BLIL, n channel and p channel sense amplifier drive signal lines STn and STp are each wired through both polycide and first metal interconnections. For the word lines, polycide and the first metal interconnections are connected only in the word line shunt region, while for bit line equalize signal line BLEQ, right and left bit line separation signal lines BLIR and BLIL, and n channel and p channel sense amplifier drive signal lines STn and STp, the polycide and the first metal interconnections are connected for every two sense amplifiers in addition to in the word line shunt region. As is the case with the word lines, the upper and lower portions of the hierarchy are placed upon each other at least at connection points, and the first metal interconnections are connected to polycide through contact holes provided in an insulating layer (not shown). Since the capacitance of these interconnections is larger than the capacitance of the word lines, if the polycide of these interconnections and the first metal interconnections are connected only in the word line shunt regions, larger delays due to polycide between these interconnections in the word line shunt region results as compared to the case of the word lines, and a delay of the operation of the semiconductor memory device may result. However, connecting them for every several amplifiers as illustrated (for every two herein) significantly reduces such interconnection delay.

In the figure, sub data lines LDL and /LDL, ground potential interconnections Vss1 and power supply potential interconnections Vcc1 are formed of the first metal interconnections, while column select line CSL, main data lines GDL, /GDL, sub data line equalize signal line /LDEQ, ground potential interconnection Vss2 and power supply potential interconnection Vcc2 are formed of the second metal interconnections.

The ground potential and power supply potential lines are connected in a lattice by the first and second metal interconnections. One column select line CSL formed of second metal interconnection is provided for every two bit line pairs, and the ground potential interconnection or power supply potential interconnection is provided for every four bit line pairs. Accordingly, in the region having memory cells arranged therein, for second metal interconnections (column select line, ground potential interconnection or power supply interconnection), three second metal interconnections are provided in a region having four bit line pairs. As illustrated, it would be possible to provide four second metal interconnections in the region having four bit line pairs by providing a ground potential interconnection or power supply interconnection at locations without a ground potential interconnection or power supply potential interconnection between column select lines, but the decrease of yield caused by foreign matters in the manufacture of semiconductor devices can be prevented by securing a large interconnection pitch for the second metal interconnections as described above.

Figure 13:
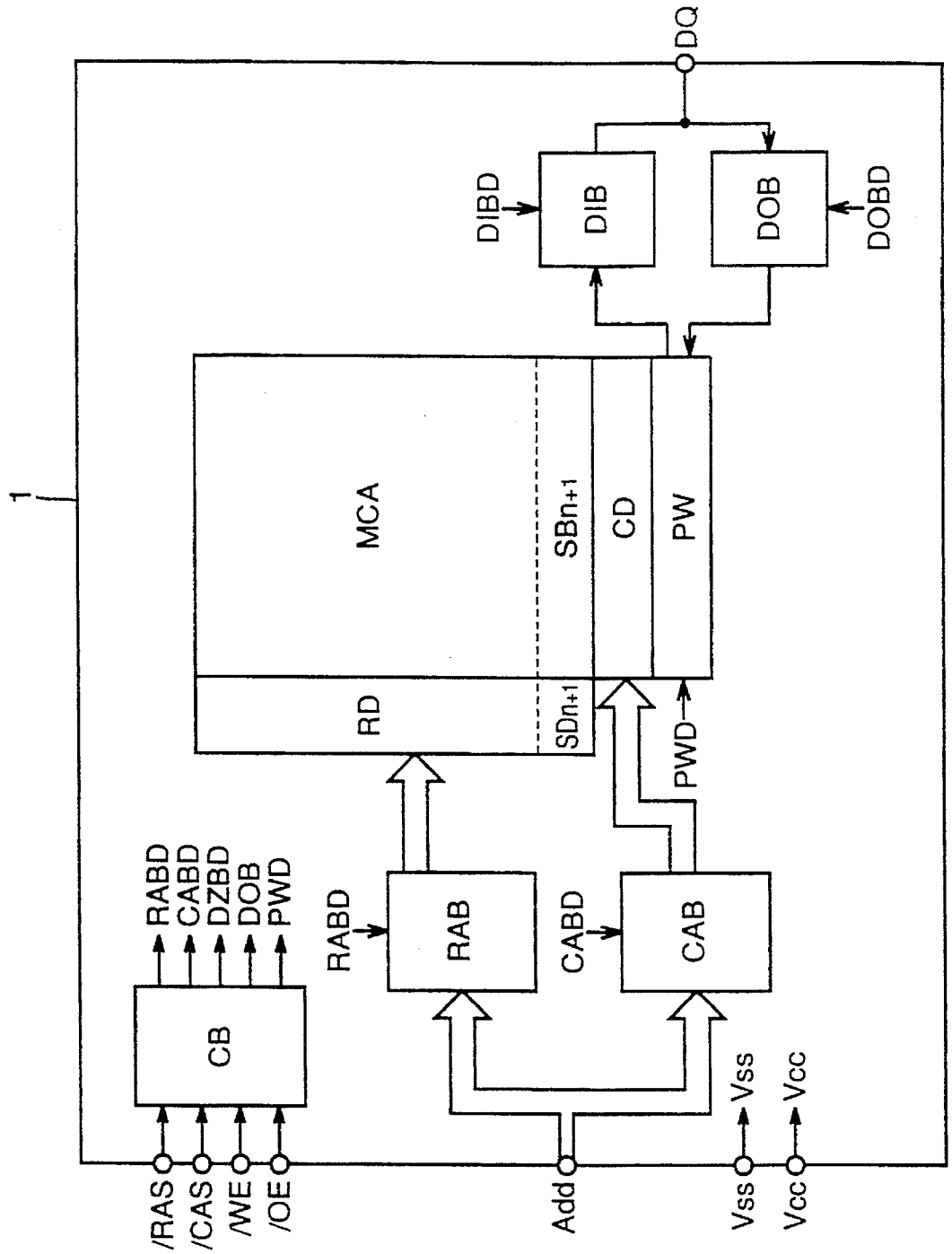
FIG. 13 is a block diagram showing a dynamic RAM including a memory cell array.

FIG. 13 is a block diagram showing a dynamic RAM including the memory cell array shown in FIG. 2. In the figure, 1 is a dynamic RAM chip, MCA is the memory cell array, RD generally designates row decoders and sense amplifier decoders, CD is a column decoder, PW is a data line input/output circuit, CB is a control signal buffer, RAB is a row address buffer, CAB is a column address buffer, DIB is a data input buffer, and DOB is a data output buffer. The dynamic RAM are connected with a row address strobe signal /RAS, a column address strobe signal /CAS, /CAS a write control signal /WE, an output control signal /OE, /OE an address signal Add, an input/output signal DQ, a ground potential Vss, and a power supply potential Vcc. In the control signal buffer, a row address buffer control signal RABD, a column address buffer control signal CABD, a data input buffer control signal DIBD, a data output buffer control signal DOBD, and a data line input/output circuit control signal PWD are generated.

Figure 14:
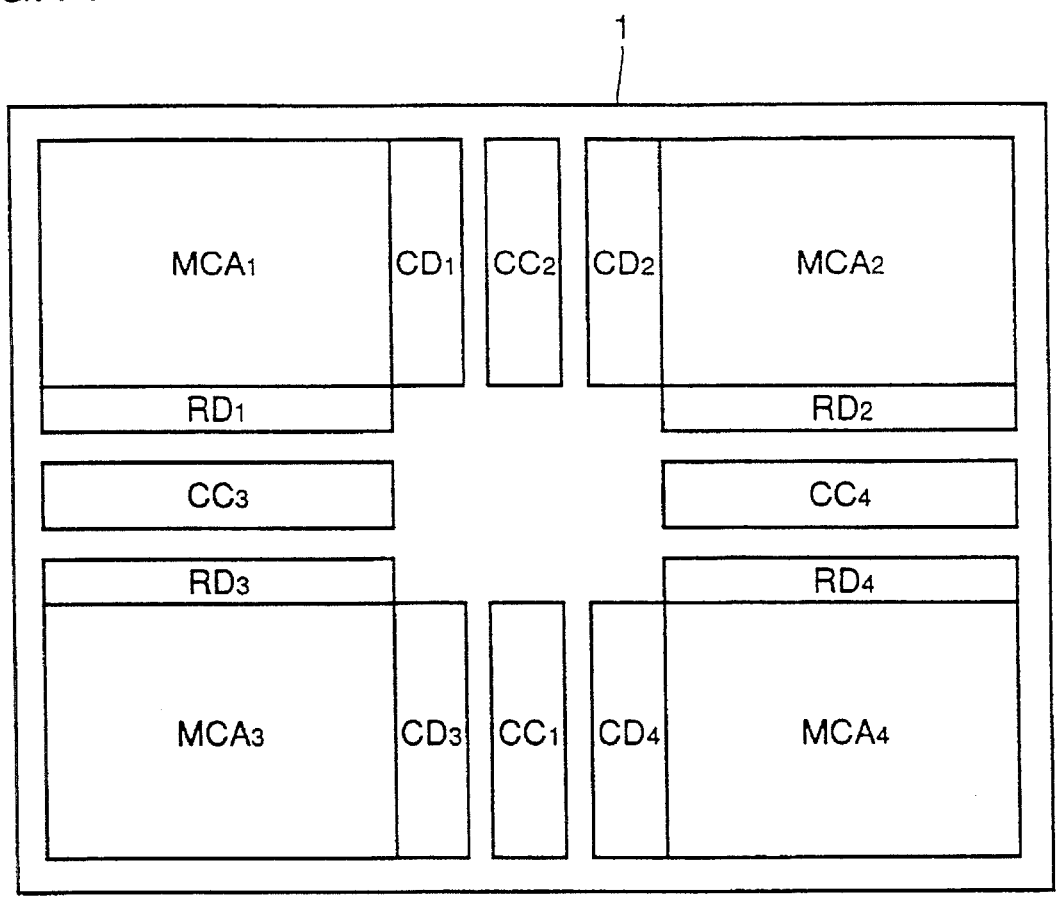
FIG. 14 is a diagram showing how elements are arranged within the chip of dynamic RAM shown in FIG. 13.

FIG. 14 shows an example of arrangement in a dynamic RAM chip 1. MCA1 to MCA4 are memory cell arrays, RD1 to RD4 are row decoders, CD1 to CD4 are column decoders, and CC1 to CC4 are control signal circuits.

The operation of thus configured semiconductor memory device in reading out information stored in memory cells will be described.

Figure 15:
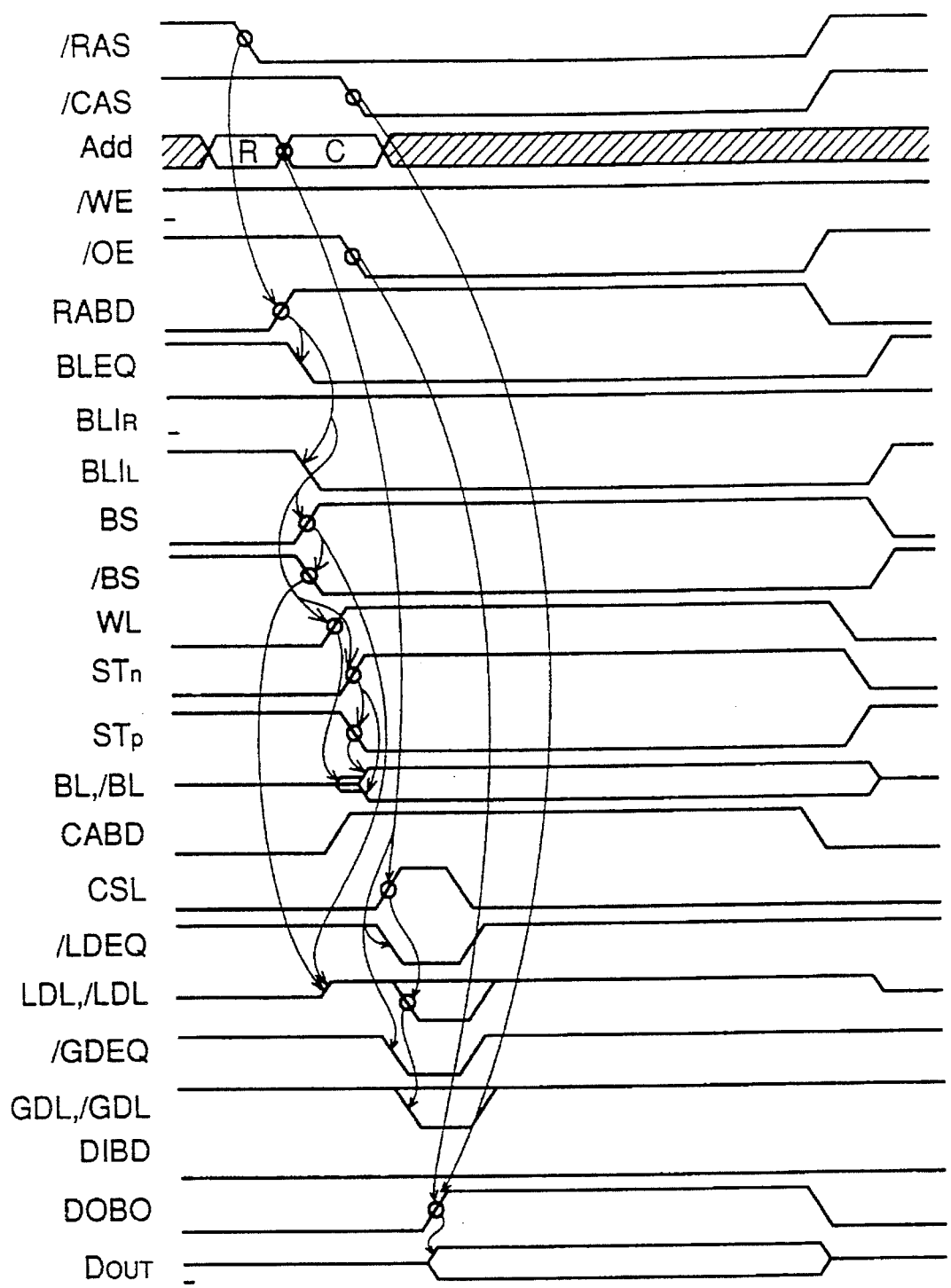
FIG. 15 is a waveform chart for use in illustration of the operation of the dynamic RAM shown in FIG. 13 in a normal mode.

FIG. 15 is a waveform chart showing the operation of the dynamic RAM in its usual mode. In the figure, in response to an activation of /RAS, row address buffer drive signal RABD is activated, and then a row address is output from the row address buffer. Then, in a sense amplifier block corresponding to a row block selected based on the row address, bit line equalize signal BLEQ is inactivated, bit line separation signal BLIL on the opposite side (on the left in FIG. 4 in the present case) to the selected memory cell block is inactivated, and the bit lines on the non-select side and the sense amplifier are isolated. Almost simultaneously with this, block select signals BS and /BS are activated. Thus, a sub data line held at the bit line precharge potential through a sub data line potential hold transistor is precharged to power supply potential Vcc through the data line gate. Then, a word line selected by a row decoder in a selected row block is activated, and the information of the memory cell is read out on bit line BL. Then, n channel and p channel sense amplifier drive signals STn and STp are activated and a potential difference between bit lines BL and /BL is amplified. Then, column select line CSL is activated and the information of the bit line is read out on the sub data line through the column gate. At the time, since block select signals BS and /BS have been activated, the information read out on the sub data line is read out on the main data line through the data line gate. In addition, up to this point, sub data line equalize signal /LDEQ and main data line equalize signal /GDEQ have been inactivated. The information read out on the main data line is amplified at the preamplifier, and transmitted to the data output circuit to be output data.

In a writing operation, write data is transferred from a data input circuit to a write circuit, then to a main data line. As opposed to the case of reading, the data is transferred onto a sub data line through a data line gate, then to a bit line through a column gate and written in a memory cell.

As in the foregoing, at the time of reading, the sub data line is once raised from the bit line equalize potential to power supply potential Vcc, and then after the reading operation once again returned to the bit line equalize potential. In the conventional semiconductor memory device, since the sub data line is not divided and the entire sub data line within a selected row sense amplifier block operates, charge/discharge of the sub data line increases power consumption. In contrast, a so-called dividing operation is conducted in this embodiment as is the case with the first embodiment, namely operating only two of sub data lines LDL11, LDL12, LDL13, and LDL14 shown in FIG. 1, the sub data lines not operating do not consume any power, and therefore power consumption by the entire device decreases as well. In addition, as compared to the first embodiment, a sense amplifier is shared between memory cells which are provided alternately, the space corresponding to one column of memory cells is saved along the column in the sense amplifier portion, and the length of the sense amplifier portion along the columns can be reduced by the amount, and therefore the length of main data lines can be reduced.

Figure 16:
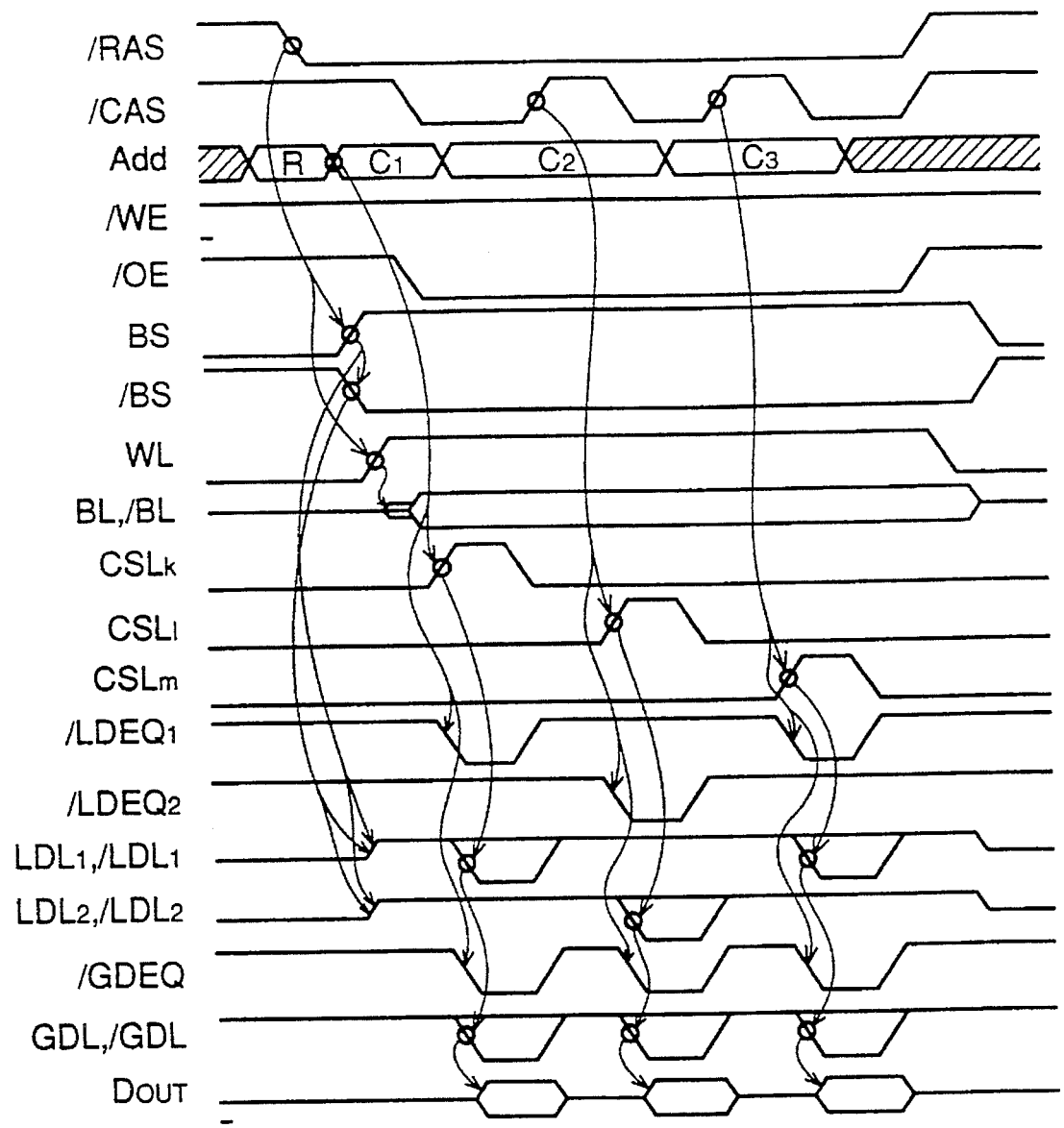
FIG. 16 is a waveform chart for use in illustration of the operation of the dynamic RAM in FIG. 13 in a page mode.

The operation in a page mode will be now described in conjunction with FIG. 16. The procedure between activation of /RAS and amplification of the potential difference between the bit lines by the operation of the sense amplifier is the same as that in the usual mode, and therefore a further description will not be provided. Assume that column addresses C1, C2, and C3 are sequentially selected in the page mode as illustrated in FIG. 16. Among them, column addresses C1 and C3 belong to column address block CB1 in FIG. 1, and column address C2 belongs to column block CB2. When column address C1 belonging to column block CB1 is selected, sub data line equalize signal /LDEQ1 and main data line equalize signal /GDEQ1 belonging to column block CB1 are inactivated. Then, column select line CSLk is activated. This transfers the information of a bit line to sub data line LDL1 and main data line GDL1. After the reading is completed, column select line CSLk becomes inactive again, and sub data line equalize signal /LDEQ1 and main data line equalize signal /CDEQ1 are activated, so that sub data lines LDL1 and /LDL1, and main data lines GDL1 and /GDL1 are equalized. Note that in the description of the page mode, LDE1 is the sub data line belonging to CB1, with a symbol corresponding to the row being omitted, while GDL1 is the main data line belonging to CB1 with the symbol being simplified.

Then, in response to a selection of column address C2 belonging to column block CB2, sub data line equalize signal /LDEQ2 and main data line equalize signal /GDEQ2 belonging to column block CB2 are inactivated. Column select line CSL1 is then activated. Thus the information of the bit line is transferred onto sub data line LDL2 and main data line GDL2. After the reading is completed, column select line CSL1 is inactivated once again, sub data line equalize signal /LDEQ2 and main data line equalize signal /GDEQ2 are activated, and sub data lines LDL2, /LDL2, and main data lines GDL2, /GDL2 are equalized.

Then, when column address signal C3 belonging to column block CB1 is once again selected, sub data line equalize signal /LDEQ1 and main data line equalize signal /GDEQ1 belonging to column block CB1 are inactivated. Column select line CSLm is then activated. Thus, the information of the bit line is transferred onto sub data line LDL1 and main data line DGL1. After the reading is completed, column select line CSLm is once again inactivated, sub data line equalize signal /LDEQ1 and main data line equalize signal /GDEQ1 are activated, and sub data lines LDL1, /LDL1, and main data lines GDL1, /GDL1 are equalized.

As in the foregoing, since a sub data line and a main data line are both provided with equalize signals /LDEQ and /GDEQ, the sub data line and the main data line both can be equalized at a high speed if column blocks are alternately switched in the page mode operation.

Figure 17:
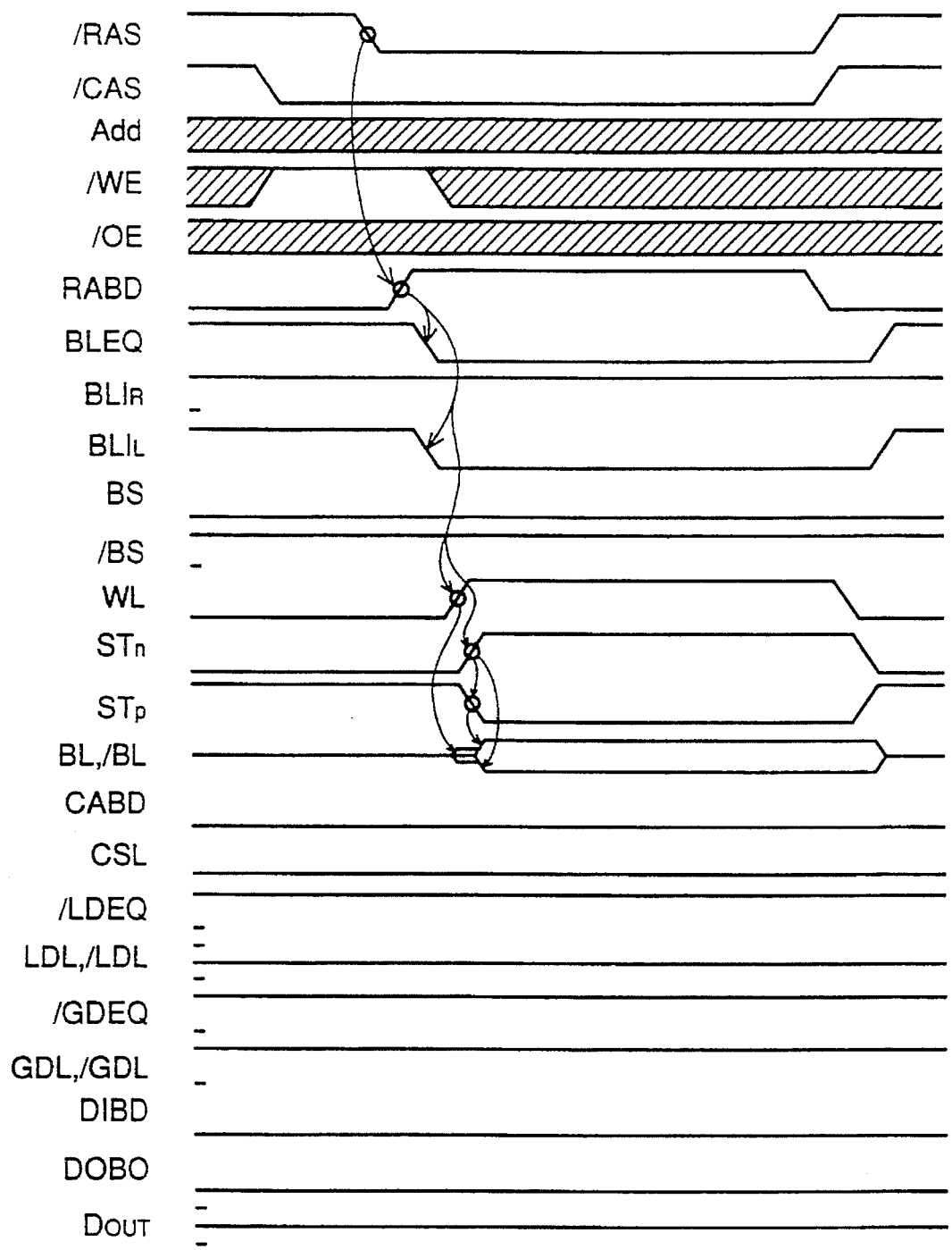
FIG. 17 is a waveform chart for use in illustration of the operation of the dynamic RAM in FIG. 13 in a /CAS before /RAS refresh mode.

The operation of the device in the /CAS before /RAS refresh (hereinafter referred to as CBR refresh) mode will be now described in conjunction with FIG. 17. In the CBR refresh mode, a row block, a sense amplifier block and a word line are selected based on a row address from a refresh counter (not shown), and the sense amplifier operates for a refresh operation. It is however not necessary to read out data in a memory cell externally from the memory cell array, and therefore a column select line is not activated as illustrated, with no data transferred to a sub data lie or a main data line. Meanwhile, in the conventional semiconductor device, block select signals BS and /BS are generated based on a row address, block select signals BS and /BS were generated in the CBR refresh mode. When such block select signals are generated, a data line gate is turned on to connect the sub data line and the main data line, the sub data line is precharged to power supply potential Vcc as well by main data line equalizer GDE circuit shown in FIG. 8. In the CBR refresh mode as described, however, it is not necessary to read out data externally from the memory cell array, which eliminates the necessity of precharging the sub data line to Vcc, and, such precharging to Vcc is not preferable in view of increase in power consumption.

Figure 18:
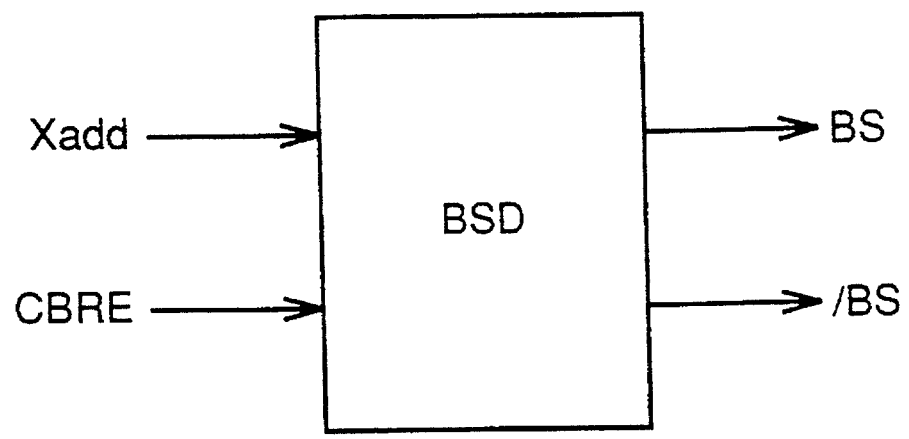
FIG. 18 is a diagram showing the configuration of a block select signal generation circuit in a sense amplifier block decoder.
Figure 19:
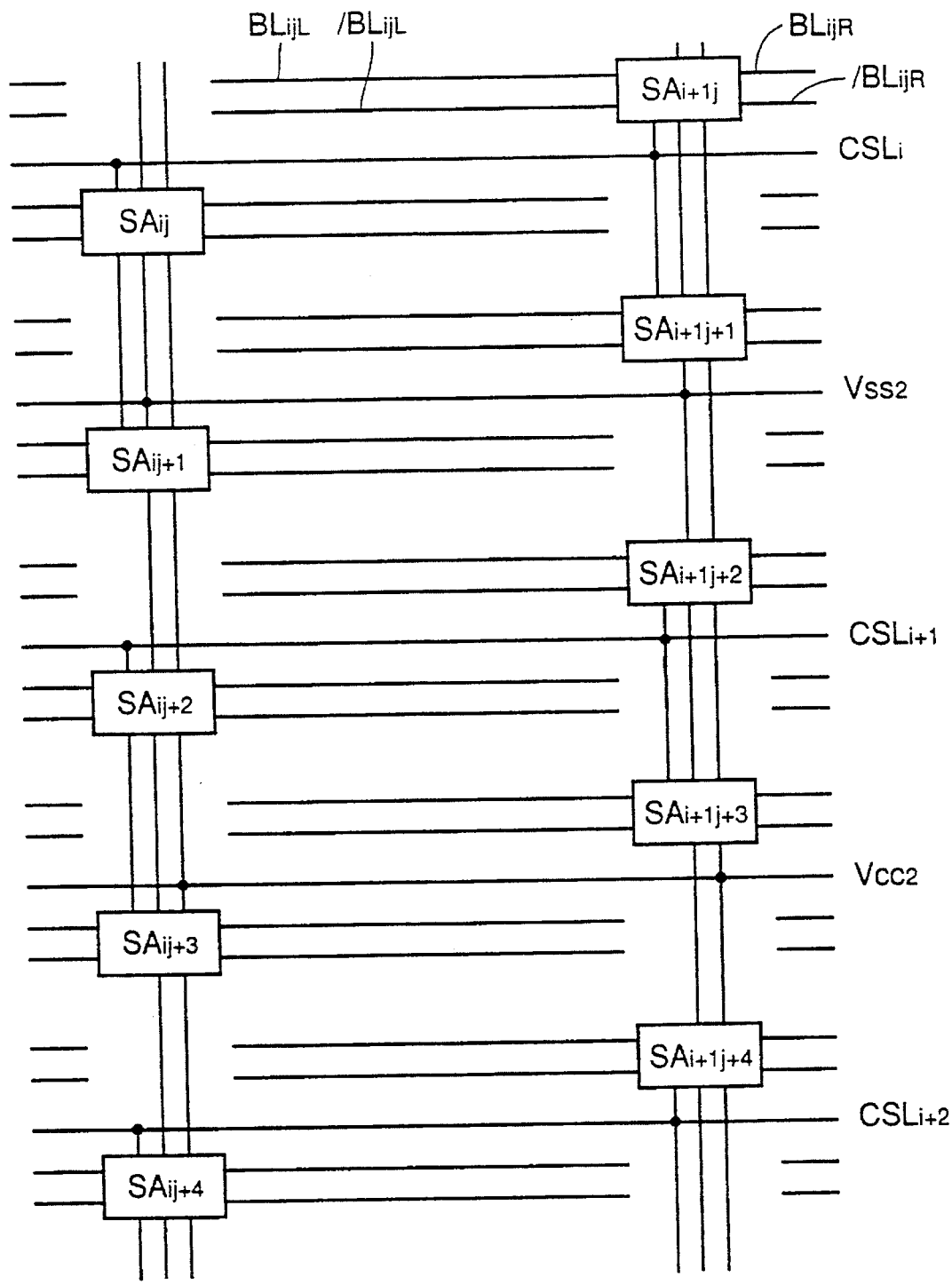
FIG. 19 is a diagram showing how bit line pairs and sense amplifiers are disposed in a memory cell array in a dynamic RAM according to a third embodiment of the invention.

Accordingly, in dynamic RAM 1, /CAS before /RAS enable signal CBRE is applied in addition to a signal Xadd based on a row address signal through a block select signal generation circuit BSD placed in the sense amplifier block decoder shown in FIG. 1 as illustrated in FIG. 18 and block select signals BS and /BS are not generated in the CBR refresh mode.

Third Embodiment

Note that although in the above-described embodiments, as illustrated in FIG. 12, for the interconnection pitch between column select lines, ground potential interconnections and power supply potential interconnections formed of the second metal interconnections, in the region having memory cells disposed, three such second metal interconnections are provided in a region having four bit line pairs, one second metal interconnection may be provided in a region having two bit line pairs by further expanding the interconnection pitch from the case shown in FIG. 12. Thus, the interconnection pitch of the second metal interconnections may be increased from the case shown in FIG. 12, and decline in yield by foreign materials in the manufacturing process of semiconductor devices may be prevented.

Fourth Embodiment

Figure 20:
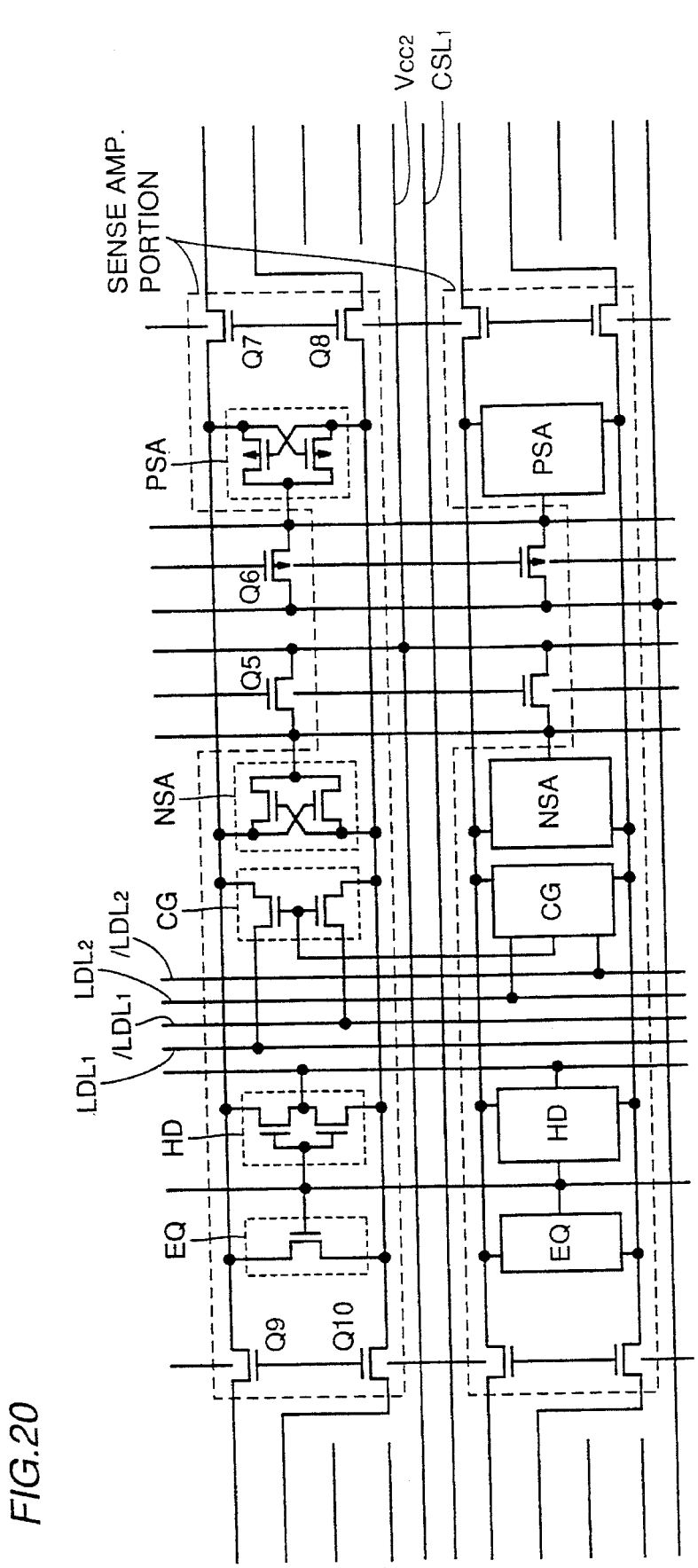
FIG. 20 is a diagram showing the configuration of a sense amplifier block portion in a memory cell array in a dynamic RAM according to a fourth embodiment of the invention.

Note that in the above embodiment, as illustrated in FIG. 4, a pair of sub data lines are provided in a sense amplifier block, but two or more pairs of sub data lines may be provided as illustrated in FIG. 20. Providing two pairs of sub data lines as illustrated in FIG. 20, for example, permits selection of two column gates in a single sense amplifier block through one column select line, which reduces the number of column select lines by half, doubles the pitch of the second metal interconnections, and decline in yield due to foreign materials in the manufacturing process of semiconductor memory devices can further be prevented.

Fifth Embodiment

Figure 21:
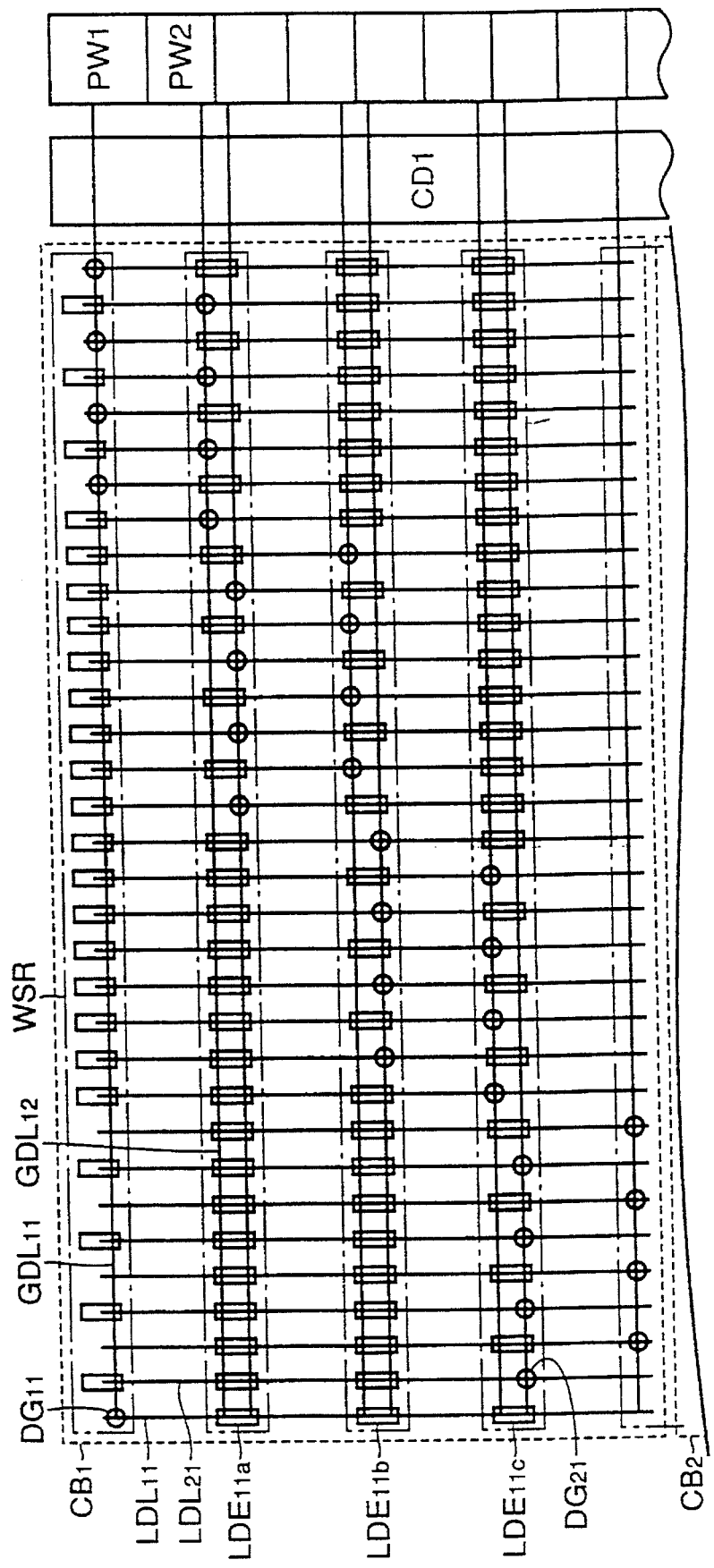
FIG. 21 is a diagram showing the arrangement of data lines in a memory cell array in a dynamic RAM according to a fifth embodiment of the invention.

In the above embodiment, two sub data line equalizers are provided for each sub data line provided in column block CB1 in the memory cell array as shown in FIG. 5, but three equalizers may be provided for each sub data line as illustrated in FIG. 21. More specifically, a data line gate is disposed at one of crossing points of one sub data line and four word line shunt regions, while sub data line equalizers are provided at the other crossing points. Thus, one sub data line can connect to more sub data line equalizers, and therefore the sub data lines can be equalized at a higher speed.

Sixth Embodiment

Figure 22:
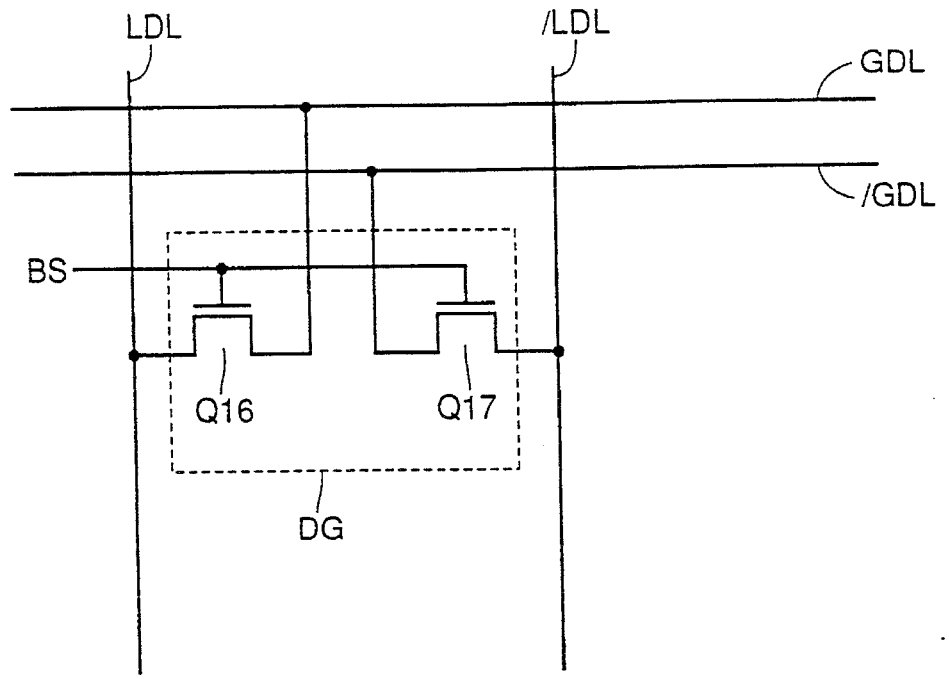
FIG. 22 is a diagram showing the configuration of a data line gate portion in a memory cell array in a dynamic RAM according to a sixth embodiment of the invention.

Note that in the above embodiment, the data line gate DG is formed of a CMOS circuit as illustrated in FIG. 6, but the gate may be formed only of an NMOS transistor as illustrated in FIG. 22. In this case, when the data line gate is turned on, the precharge potential of the main data line is at power supply potential Vcc, while the precharge potential of the sub data line is at Vcc-Vth1 (Vth1: the threshold voltage of the NMOS transistor constituting the data line gate).

Seventh Embodiment

Figure 23:
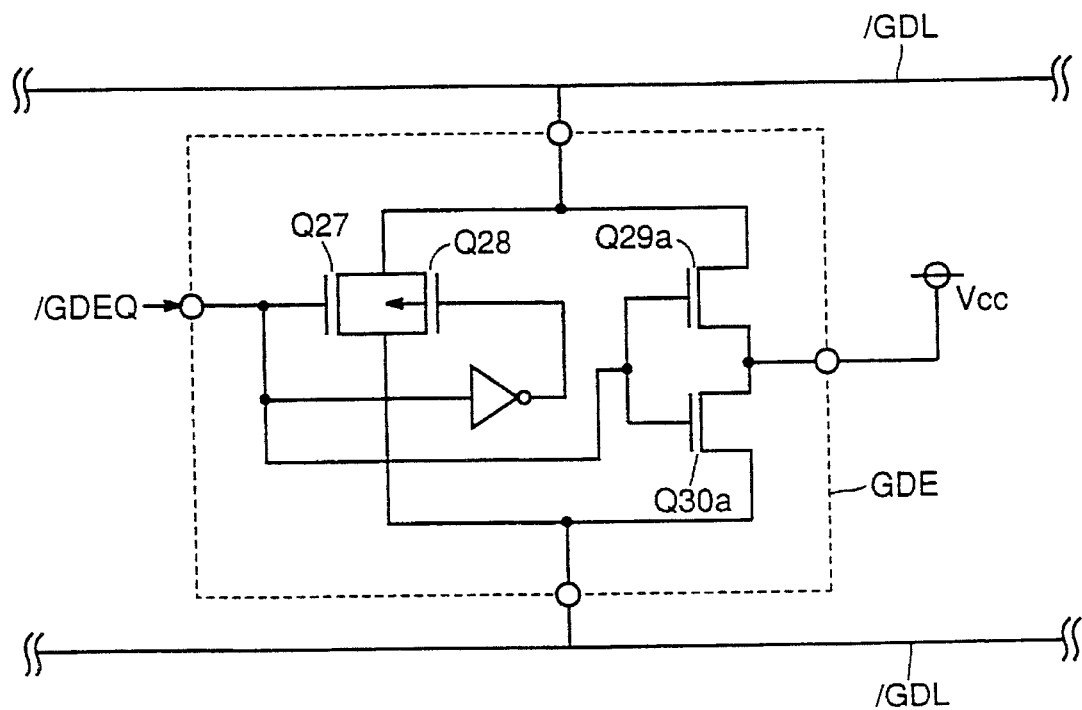
FIG. 23 is a diagram showing the configuration of a data line input/output circuit portion in a dynamic RAM according to a seventh embodiment of the invention.
Figure 24:
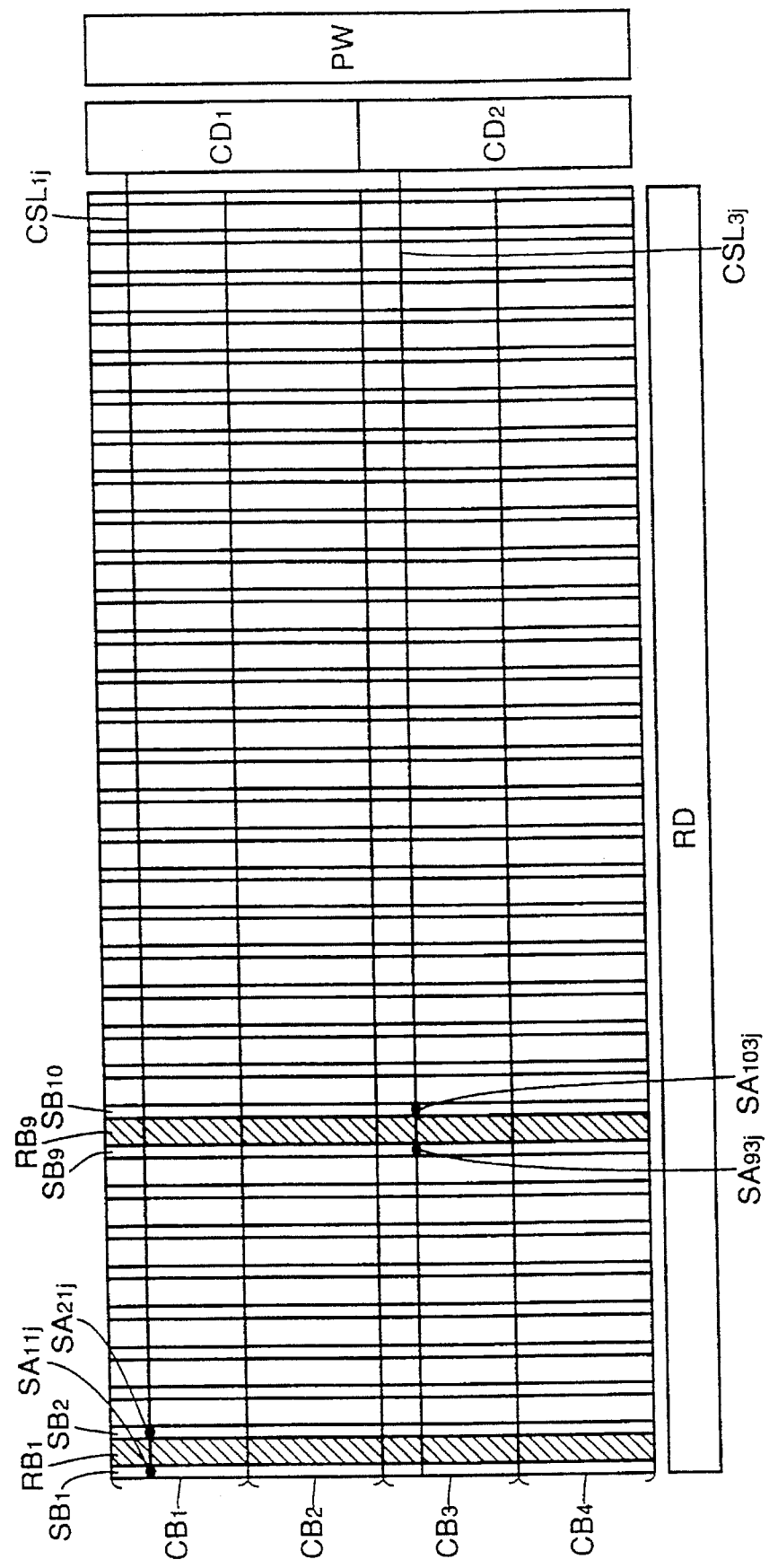
FIG. 24 is a diagram showing a position to select four bits at a time from a memory cell array in a dynamic RAM according to an eighth embodiment of the invention.

With main data line equalizer GDE, main data lines GDL and /GDL are precharged to power supply potential Vcc by p channel transistors Q29 and Q30 as illustrated in FIG. 8 in the above embodiment, while the data lines may be precharged to Vcc-Vth2 (Vth2: the threshold voltages of transistors Q29a and Q30a) by NMOS transistors Q29a and Q30a as illustrated in FIG. 23.

Eighth Embodiment

Note that in the above embodiment, as illustrated in FIG. 10, when four bits are selected from one memory cell array at a time, one bit is each selected from crossing points of sense amplifier block SB1 and column select lines CSL1$j$ and CSL3$j$, and crossing points of sense amplifier block SB9 and column select lines CSL1$j$, CSL3$j$, but one bit may be selected each from a crossing point of sense amplifier block SB1 and column select line CSL1$j$, a crossing point of sense amplifier block SB2 and column select line CSL1j, a crossing point of sense amplifier block SB9 and column select line CSL3j and a crossing point of sense amplifier block SB10 and column select line CSL3j.

Ninth Embodiment

Figure 25:
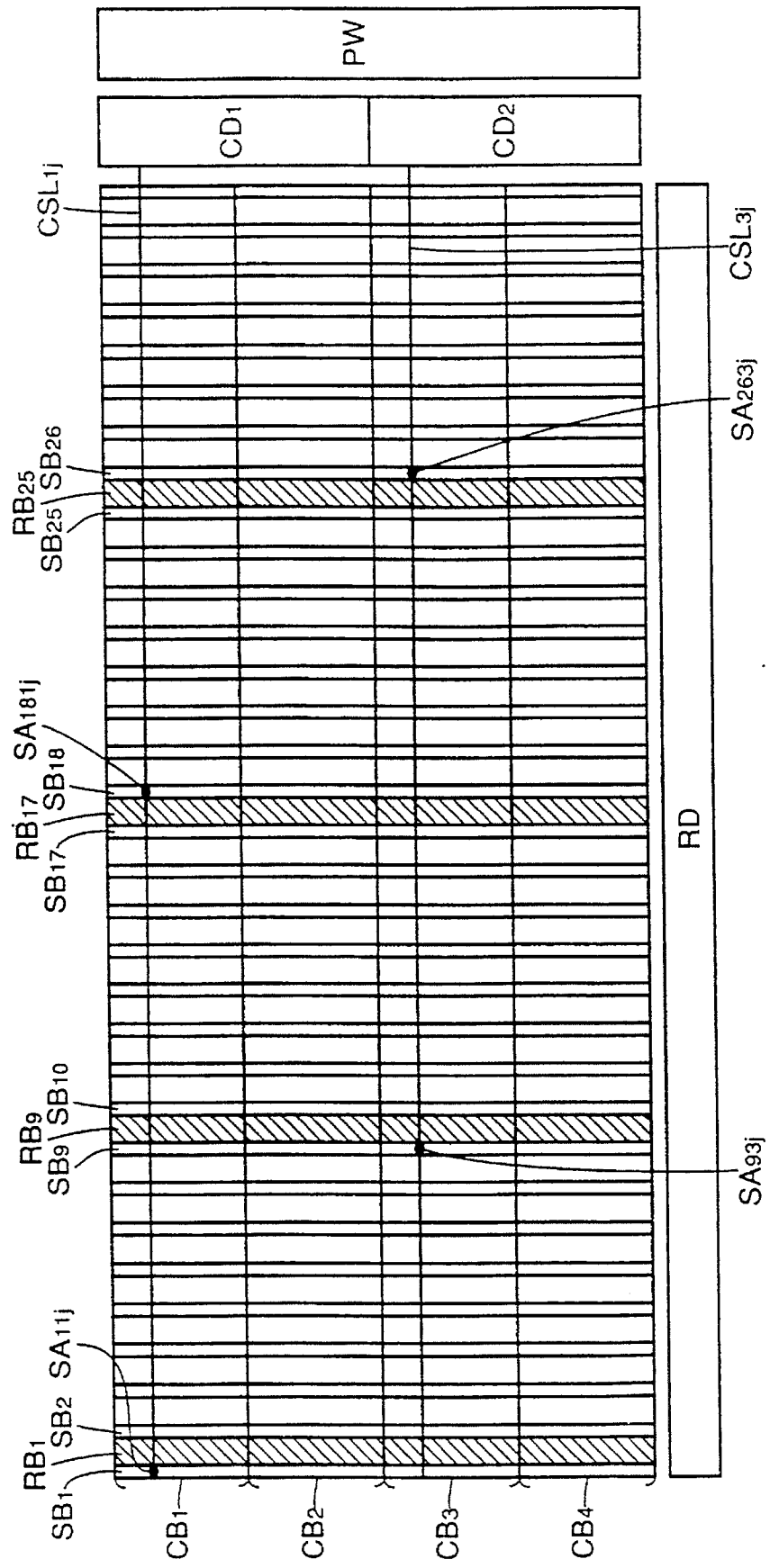
FIG. 25 is a diagram showing a position to select a row block in a memory cell array in a dynamic RAM according to a ninth embodiment of the invention in a different refresh cycle.

In the above embodiment, two row blocks are selected in one memory cell array as illustrated in FIG. 9. If the case in FIG. 9 is different from the refresh cycle, in other words if FIG. 9 corresponds to 8192 refresh cycle, 4090 refresh cycle may be conducted by selecting twice as many row blocks as the case in FIG. 9, in other words four row blocks in one memory cell array as illustrated in FIG. 25.

Tenth Embodiment

Figure 26:
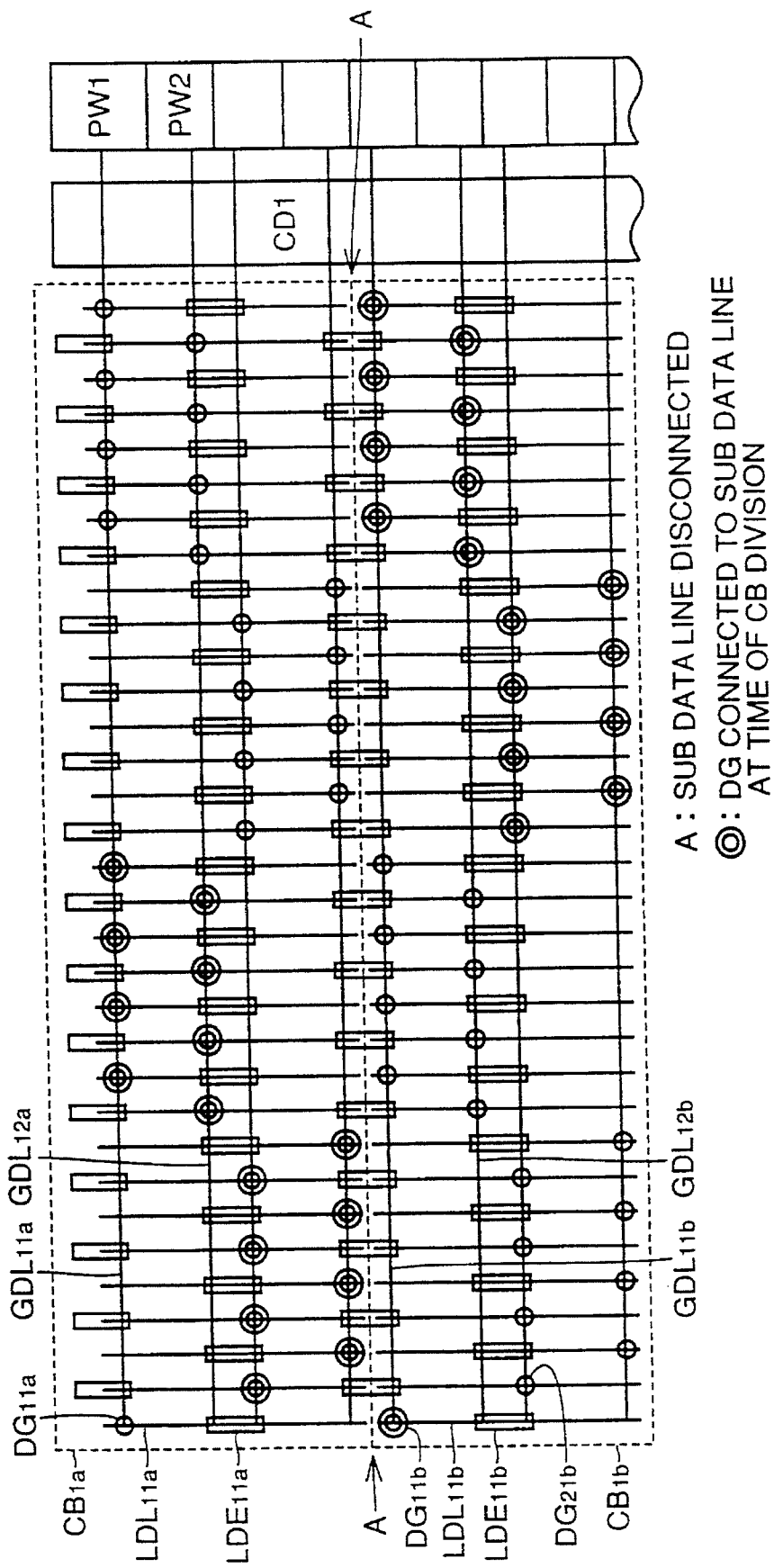
FIG. 26 is a diagram showing the arrangement of data lines in a memory cell array in a dynamic RAM according to a tenth embodiment of the invention.

Note that in the above embodiment, one sub data line is as long as four memory cell-provided regions as illustrated in FIG. 5, but the length may be different. FIG. 26 shows an arrangement of column blocks in which the sub data line length is for two memory cell-provided regions. As shown, considering repetition of column blocks, one sub data line has two crossing points with a word line shunt region. One of the crossing points is provided with a data line gate, and the other with a sub data line equalizer.

By contrast to the configuration shown in FIG. 5, the configuration shown in FIG. 26 has additional data line gates DG denoted with double circles, and the sub data line pairs along line A—A are disconnected.

Now, how to separately use the configuration shown in FIG. 5 and the configuration shown in FIG. 26 will be described. If you compare the case in which the length of one sub data line corresponds to four memory cell-provided regions as shown in FIG. 5 and the case of two regions in FIG. 26, the case of the two regions consumes less power. However, considering the use of redundant circuitry (not shown) used for repairing failed memory cells, repairment efficiency would be higher for the case of the four regions.

More specifically, redundant memory cells are provided for a usual memory cell region at a fixed rate so as to replace failed memory cells in the memory cell region. Thus, the rate of repairment is higher for the configuration having a wider range of repairment for memory cells with each redundant memory cell.

In the case the sub data line length is for the two-memory cell regions as shown in FIG. 26, such redundant memory cells are provided for every two memory cell regions at a fixed rate. If, for example, two columns of redundant memory cells are provided for two memory cell regions, four columns of redundant memory cells will be provided for four memory cell regions. The two columns of redundant memory cells provided for the two memory cell regions are generally adapted to replace failed memory cells only within these two memory cell regions.

Meanwhile, in the case of the four memory cell regions shown in FIG. 5, redundant memory cells are provided for every four memory cell regions at a fixed rate. If, for example, redundant memory cells equal in area to the case of FIG. 26 are provided, four columns of redundant memory cells are provided for every four memory cell regions, and these redundant memory cells are adapted to replace failed memory cells in the four regions.

Accordingly, although four columns of redundant memory cells will be provided in four memory cell regions in both cases, providing four columns of redundant memory cells for every four memory cell regions usually provide a wider repairable range with the redundant memory cells and failures in the four regions are repairable, resulting in a higher yield.

As described above, the case of the sub data line length corresponding to the two memory cell regions as illustrated in FIG. 26 advantageously reduces power consumption, while the case of the sub data line length equal to the four memory cell regions as illustrated in FIG. 5 advantageously increases yield. Accordingly, employing both configurations in a single dynamic RAM chip can provide functions for these different purposes.

To this end, at crossing points of sense amplifier blocks and word line shunt regions, data line gates the sub gate line length of which increases from the case of the sub data line length equal to four memory cell regions as shown in FIG. 5 to the case of sub data line length equal to two memory cell regions shown in FIG. 26. If the sub data line length is as long as four memory cell regions, the sub data lines are connected at the A—A regions in FIG. 26 so that the sub data line length is equal to four regions by the first metal interconnection forming the sub data lines, and the data line gates denoted at double circle are kept disconnected from the sub data lines.

In such a configuration, the sub data lines may be formed into the length of four or two memory cell regions by the master slice method with the first metal interconnection, and configurations suitable for the above-described objects may be implemented.

Figure 27:
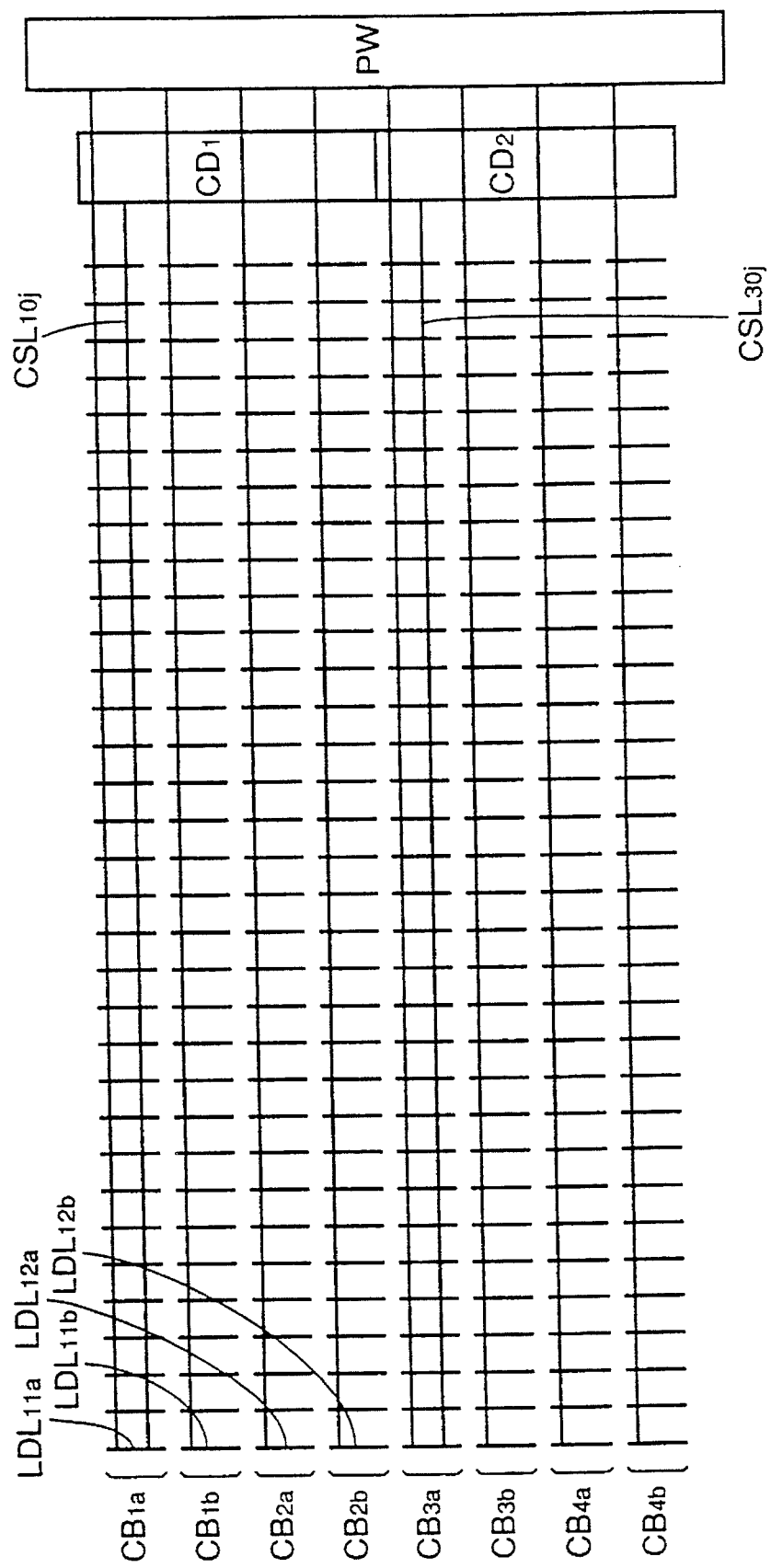
FIG. 27 is a diagram showing the configuration of a memory cell array including the column blocks shown in FIG. 26.

The configuration of a memory cell array including column blocks shown in FIG. 26 is shown in FIG. 27. As illustrated in FIG. 27, memory cell array MCA is divided into eight column blocks CB1a, CB1b–CB4a, and CB4b, and one column select line is each activated in two blocks of these eight column blocks. The figure shows the case in which column select lines CB1aj and CB3aj are activated in column blocks CB1a and CB3a, respectively. In this case, in sense amplifier block SB1, only LDL11a and LDL13a operate among sub data line pairs LDL11a, LDL11b–LDL14a, and LDL14b, and the other six sub data lines do not operate. The sub data line length is ½ that in embodiments 1 and 2, power consumed by charging the sub data lines will be ½ that in the case shown in FIG. 1, and further reduction of power consumption is enabled.

Eleventh Embodiment

Figure 28:
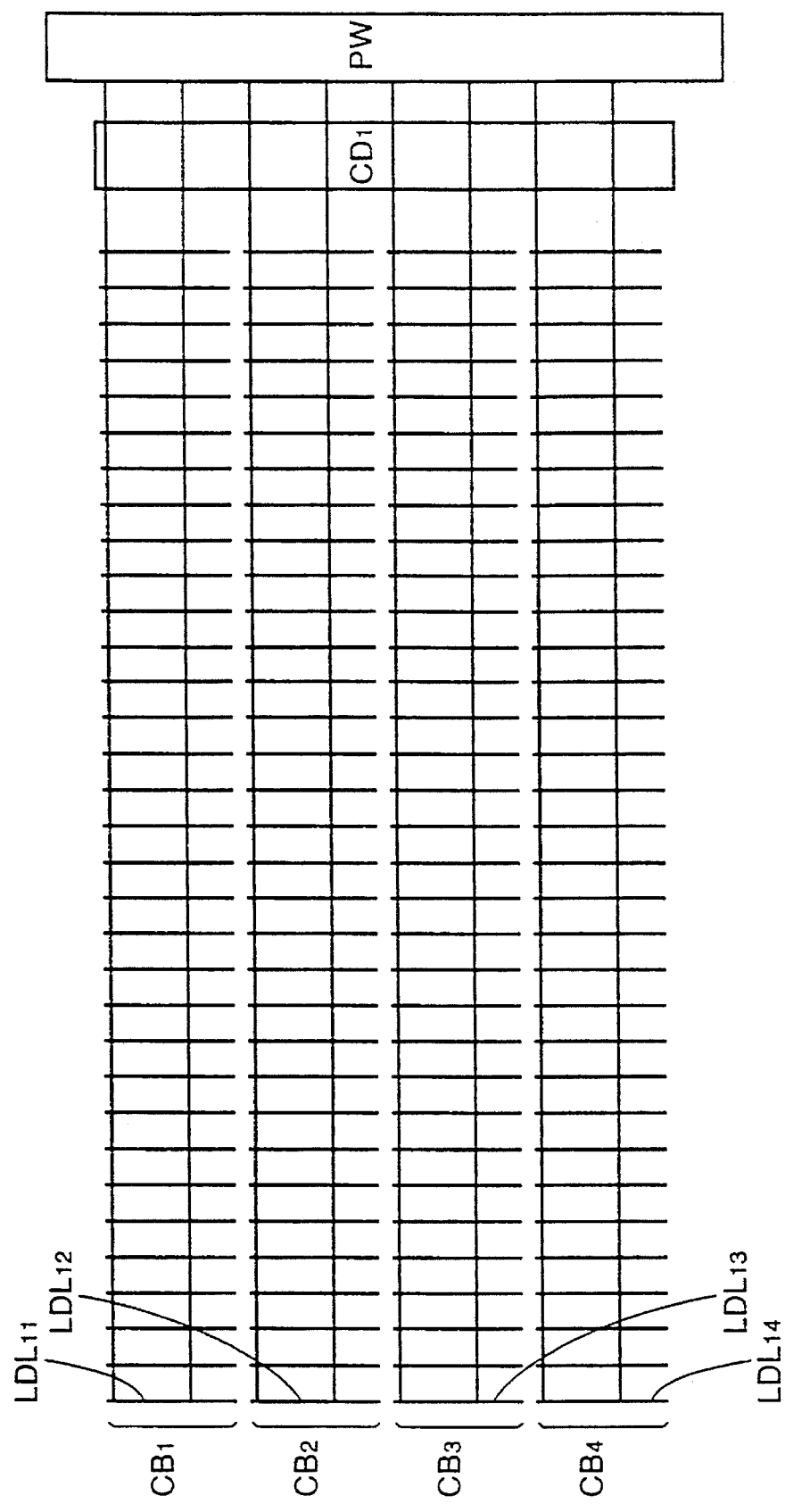
FIG. 28 is a diagram showing the arrangement of data lines in a memory cell array in a dynamic RAM according to an eleventh embodiment of the invention.
Figure 29:
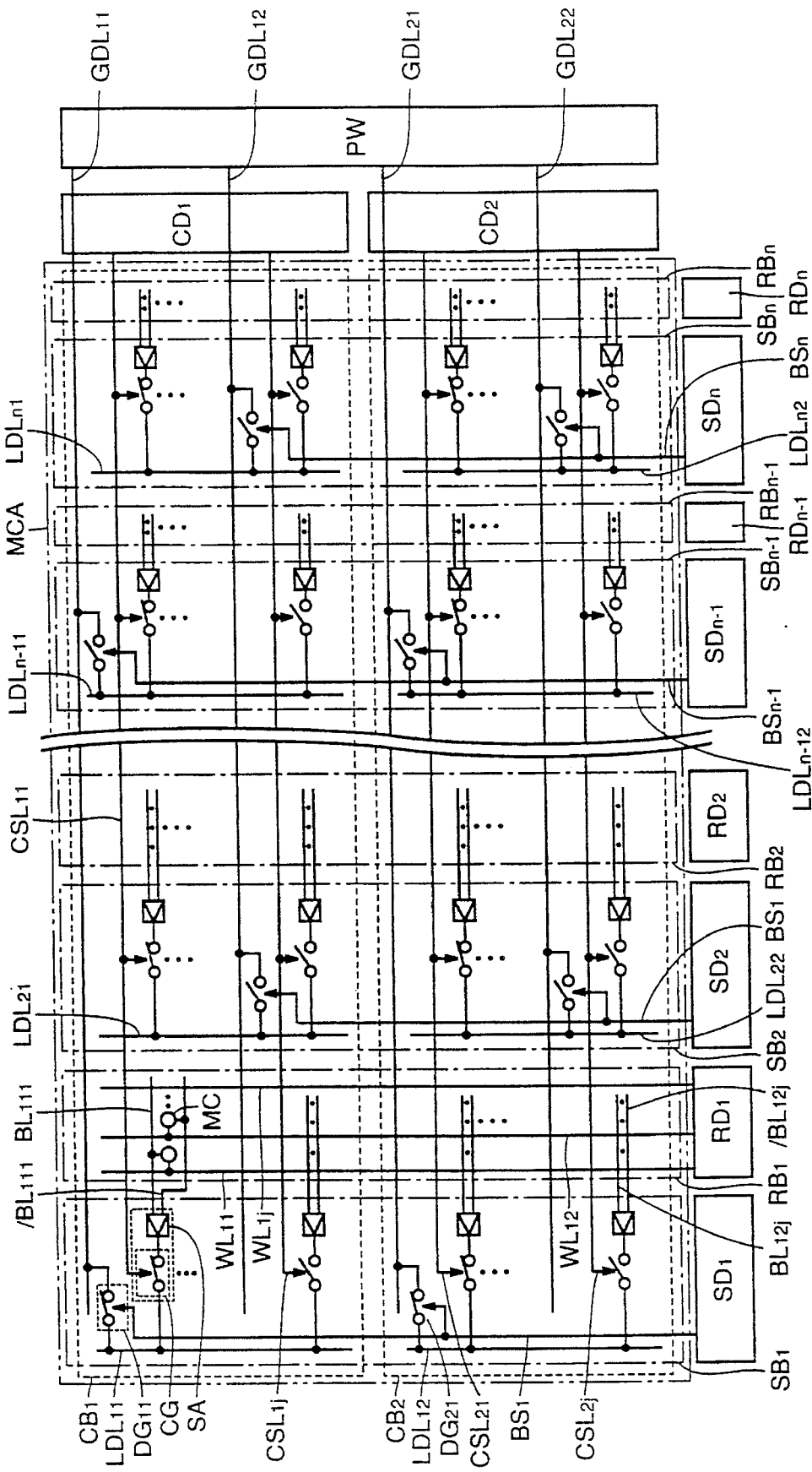
FIG. 29 is a diagram showing the configuration of a memory cell array in a conventional dynamic RAM.
Figure 30:
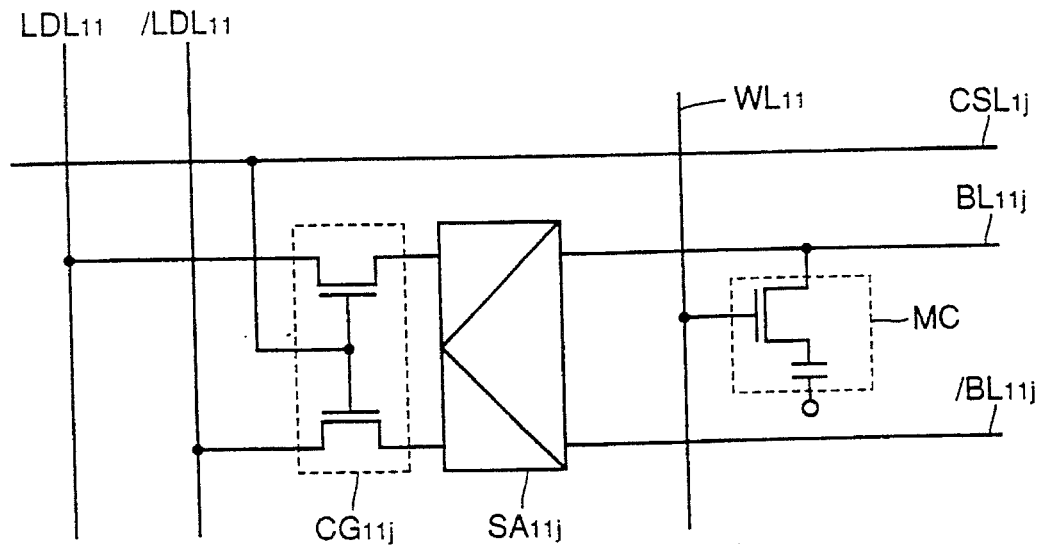
FIG. 30 is a diagram showing the configuration of the sense amplifier block portion in the memory cell array shown in FIG. 29.
Figure 31:
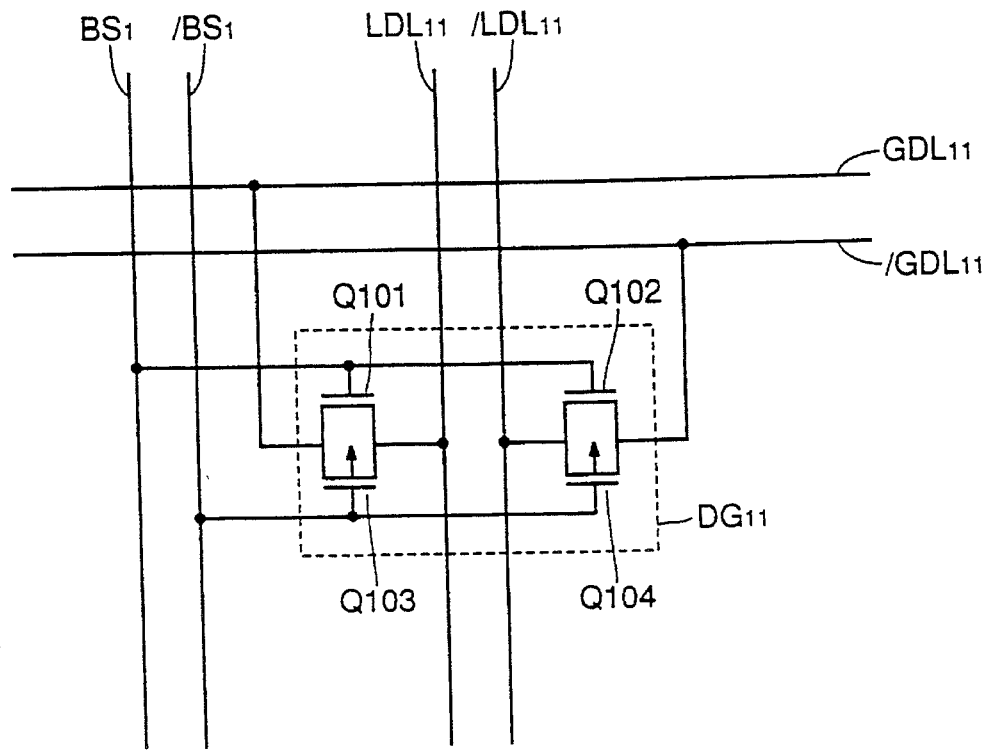
FIG. 31 is a diagram showing the configuration of the data line gate portion in the memory cell array shown in FIG. 29.

Note that in the above embodiments, a plurality of sub data lines are selected at a time in a sense amplifier block as shown in FIG. 1, but only a pair of sub data lines simultaneously selected by a column address in a sense amplifier block as shown in FIG. 28 may be selected. As illustrated, memory cell array MCA is divided into four column blocks CB1 to CB4, and one column select line in one of these four column blocks is activated. For example, only LDL11 among sub data lines LDL11 to LDL14 operates in sense amplifier block SB1, and the other three sub data lines do not operate. By contrast with the case shown in FIG. 1, the number of sub data lines to be selected is ½, thus power consumed by charging the sub data lines will be ½ the case shown in FIG. 1, and further reduction of power consumption is enabled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a first memory cell group and a column decoder provided corresponding to said first memory cell group, wherein only one of a plurality of columns in said first memory cell group is selected by said column decoder, and said first memory cell group is divided into a plurality of second memory cell groups in the direction of columns, said semiconductor memory device comprising a plurality of sub data lines for said first memory cell group, said first memory cell group including a plurality of third memory cell groups produced by dividing said plurality of second memory cell groups in a direction of rows with said plurality of sub data lines provided for each said third memory cell group, a plurality of main data lines provided for each second memory cell group, a main data line being selectively connected with said plurality of sub data line, and only said sub data line corresponding to said second memory cell group having a column selected by said column decoder being precharged to a potential of said main data line.

2. A semiconductor memory device as recited in claim 1, further comprising a plurality of sense amplifier blocks cell group and including a sense amplifier for amplifying data output from said third memory cell group, said plurality of sense amplifier blocks provided between and on both ends of said third memory cell groups, said plurality of sense amplifier blocks each selectively amplifying one of data output from said third memory cell groups provided on both sides.

3. A semiconductor memory device as recited in claim 1, wherein a plurality of said first memory cell groups are provided, said column decoder is provided for each of said plurality of first memory cell groups, said plurality of first memory cell groups each include a plurality of word lines, and a row of said plurality of first memory cell groups are selected by one word line.

4. A semiconductor memory device as recited in claim 3, further comprising a plurality of row decoders for selecting said word line, wherein said sub data line extends in the direction of rows, said main data line extends in the direction of columns, said column decoder is provided on one end of said plurality of main data lines, and said row decoder is provided on one end of said plurality of word lines.

5. A semiconductor memory device as recited in claim 4, further comprising:

a plurality of select means for selecting a prescribed third memory cell group from said plurality of third memory cell groups; and a preamplifier for amplifying a signal transmitted on said main data line, said plurality of select means each provided alternately with each of said plurality of row decoders.

6. A semiconductor memory device including a first memory cell group and a column decoder provided corresponding to said first memory cell group, wherein only one of a plurality of columns in said first memory cell group is selected by said column decoder, and said first memory cell group is divided into a plurality of second memory cell groups in the direction of columns, said semiconductor memory device comprising a plurality of sub data lines for said first memory cell group, said first memory cell group including a plurality of third memory cell groups produced by dividing said plurality of second memory cell groups in a direction of rows with said plurality of sub data lines provided for each said third memory cell group, a plurality of main data lines provided for each second memory cell group, a respective main data line being selectively connected with said plurality of sub data line, only said sub data line corresponding to said second memory cell group having a column selected by said column decoder being precharged to a prescribed potential, an interconnection layer formed along the rows is formed of a metal interconnection layer in a first layer, and an interconnection layer formed along the columns is formed of a metal interconnection layer in a second layer.

7. A semiconductor memory device including a plurality of memory cell groups, comprising:

a plurality of sub data lines provided for each of said plurality of memory cell groups, a main data line selectively connected to said plurality of sub data lines, equalize means for equalizing said sub data line, said equalize means equalizing said sub data line according to a first equalize signal based on a row address signal, and a second equalize signal based on a column address signal, a first equalize signal line extending in a direction of rows for transmitting said first equalize signal, and a second equalize signal line extending in a direction of columns for transmitting said second equalize signal, wherein said first equalize signal line is formed of a metal interconnection layer in a first layer, and said second equalize signal line is formed of a metal interconnection layer in a second layer.

8. A semiconductor memory device including a plurality of memory cell groups, comprising:

a plurality of sub data lines provided for each of said plurality of memory cell groups, a main data line selectively connected to said plurality of sub data lines, and equalize means for equalizing said sub data line, wherein said equalize means equalizing said sub data line according to a first equalize signal based on a row address signal, and a second equalize signal based on a column address signal, said memory cell groups are provided in a matrix, said semiconductor memory device, further comprising:

a column decoder for selecting a prescribed column from a plurality of first groups including one column of memory cell groups along the columns among said plurality of memory cell groups, and a plurality of select means provided for each of a plurality of second groups including one row of memory cell groups along the rows among said plurality of memory cell groups for selecting a prescribed memory cell group from said second group.

9. A semiconductor memory device including a plurality of memory cell groups comprising:

a plurality of sub data lines provided for each of said plurality of memory cell groups;

a main data line provided corresponding to said plurality of sub data lines;

a plurality of switch means for connecting said plurality of sub data lines and said main data line; and a plurality of equalize means for equalizing said sub data lines, said plurality of switch means and equalize means being previously provided on a semiconductor substrate and selectively connected by said sub data line.

10. A semiconductor memory device including a first memory cell group and a column decoder provided corresponding to said first memory cell group, wherein only one of a plurality of columns in said first memory cell group is selected by said column decoder and said first memory cell group is divided into a plurality of second memory cell groups, the semiconductor memory device comprising a plurality of sub data lines provided for each said second memory cell group, and a main data line corresponding to said plurality of sub data lines.

11. A semiconductor memory device including a plurality of first memory cell groups, a column decoder provided corresponding to each first memory cell group, and a data line input/output circuit provided corresponding to the column decoders, wherein only one of a plurality of columns in said each first memory cell group is selected by said column decoder, and said each first memory cell group is divided into a plurality of second memory cell groups in the direction of columns, said semiconductor memory device comprising a plurality of sub data lines for said each first memory cell group, said each first memory cell group including a plurality of third memory cell groups produced by dividing said plurality of second memory cell groups in a direction of rows with said plurality of sub data lines provided for each said third memory cell group, a plurality of main data lines provided for each second memory cell group, a main data line being selectively connected with said plurality of sub data line, only said sub data line corresponding to said each second memory cell group having a column selected by said column decoder being precharged to a prescribed potential, and said data line input/output circuit being provided on one end of said plurality of main data lines.

12. A semiconductor memory device including a plurality of memory cell groups, comprising:

a plurality of sub data lines provided for each of said plurality of memory cell groups, a main data line selectively connected to said plurality of sub data lines, and equalize means for equalizing said sub data line, said equalize means equalizing said sub data line according to a first equalize signal based on a row address signal, and a second equalize signal based on a column address signal.

13. A semiconductor memory device as recited in claim 12, further comprising:

a first equalize signal line extending in a direction of rows for transmitting said first equalize signal, and a second equalize signal line extending in a direction of columns for transmitting said second equalize signal.

14. A semiconductor memory device including a plurality of memory cell groups, comprising:

a plurality of sub data lines provided for each of said plurality of memory cell groups;

a main data line provided corresponding to said plurality of sub data lines; and switch means for connecting said plurality of sub data lines and said main data line, said sub data line being precharged by a potential of said main data line through said switch means.

15. A semiconductor memory device as recited in claim 21, wherein said memory cell groups are provided in a matrix, said semiconductor memory device further comprising a column decoder for selecting a prescribed column from a plurality of first groups including one column of memory cell groups along the columns among said plurality of memory cell groups, and a plurality of select means provided for each of the plurality of second groups including one row of memory cell groups along the rows among said plurality of memory cell groups for selecting a prescribed memory cell group from said second group.

16. A semiconductor memory device including a plurality of memory cell groups comprising:

a plurality of sub data lines provided for each of said plurality of memory cell groups;

a main data line provided corresponding to said plurality of sub data lines;

a plurality of switch means for connecting said plurality of sub data lines and said main data line; and a plurality of equalize means for equalizing said sub data lines, wherein said plurality of switch means and equalize means are previously provided on a semiconductor substrate and selectively connected by said sub data line, and said main data line is provided on a word line shunt region for said plurality of memory cell groups.

17. A semiconductor memory device as recited in claim 16, further comprising an equalize signal line for transmitting an equalize signal for controlling the operation of said equalizing means based on a column address signal, said equalize signal line being provided on said word line shunt region.

18. A semiconductor memory device as recited in claim 17, further comprising a plurality of sense amplifier blocks provided corresponding to said plurality of memory cell groups and each including a sense amplifier for amplifying data in said memory cell group, said switch means being provided on a crossing point of said sense amplifier block and said word line shunt region.

19. A semiconductor memory device as recited in claim 18, wherein said equalize means is provided on crossing points of said plurality of sense amplifier blocks and said word line shunt region.

* * * * *